(12) United States Patent
Lu et al.

(10) Patent No.: US 11,462,609 B2
(45) Date of Patent: Oct. 4, 2022

(54) CAPACITOR AND MANUFACTURING METHOD THEREFOR

(71) Applicant: SHENZHEN GOODIX TECHNOLOGY CO., LTD., Shenzhen (CN)

(72) Inventors: Bin Lu, Shenzhen (CN); Jian Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/033,874

(22) Filed: Sep. 27, 2020

(65) Prior Publication Data

US 2021/0013302 A1   Jan. 14, 2021

Related U.S. Application Data

(63) Continuation of application No. PCT/CN2019/079677, filed on Mar. 26, 2019.

(51) Int. Cl.
| | | |
|---|---|---|
| H01L 23/532 | (2006.01) |
| H01L 29/94 | (2006.01) |
| H01G 11/04 | (2013.01) |
| H01G 4/38 | (2006.01) |
| H01G 4/33 | (2006.01) |

(Continued)

(52) U.S. Cl.
CPC ........ H01L 28/91 (2013.01); H01L 23/53209 (2013.01); H01L 23/53271 (2013.01); H01L 23/53276 (2013.01); H01L 28/56 (2013.01)

(58) Field of Classification Search
CPC ..... H01L 23/5223; H01L 28/55; H01L 28/75; H01L 23/53209; H01L 23/53271; H01L 23/53276; H01L 23/64; H01L 28/86; H01L 28/91; H01L 28/56; H01L 28/90
See application file for complete search history.

(56) References Cited

U.S. PATENT DOCUMENTS

| | | | |
|---|---|---|---|
| 5,240,871 A | 8/1993 | Doan et al. |
| 5,834,357 A | 11/1998 | Kang |
| 6,078,493 A | 6/2000 | Kang |

(Continued)

FOREIGN PATENT DOCUMENTS

| | | |
|---|---|---|
| CN | 102800565 A | 11/2012 |
| CN | 105097765 A | 11/2015 |
| EP | 0 814 498 A1 | 12/1997 |

*Primary Examiner* — Omar F Mojaddedi
(74) *Attorney, Agent, or Firm* — Scully Scott Murphy & Presser

(57) ABSTRACT

A capacitor includes: at least one multi-wing structure including N axes and M wings, where the N axes extend along a first direction, and the M wings are a convex structure formed by extending from side walls of the N axes toward a direction perpendicular to the first direction, a first wing of the M wings and the N axes are formed of a first conductive material, and other wings are formed of a second conductive material; a conductive structure cladding the multi-wing structure; a dielectric layer disposed between the multi-wing structure and the conductive structure to isolate the multi-wing structure from the conductive structure; a first external electrode electrically connected to some or all multi-wing structures; and a second external electrode electrically connected to the conductive structure.

16 Claims, 15 Drawing Sheets

(51) Int. Cl.
*H01L 23/522* (2006.01)
*H01L 49/02* (2006.01)

(56) References Cited

U.S. PATENT DOCUMENTS

| | | | |
|---|---|---|---|
| 6,127,220 A | 10/2000 | Lange et al. | |
| 8,384,191 B2 | 2/2013 | Kuan | |
| 2003/0179521 A1 | 9/2003 | Girardie | |
| 2004/0002187 A1* | 1/2004 | Block | H01L 28/87 |
| | | | 257/E27.048 |
| 2012/0299153 A1 | 11/2012 | Kuan | |
| 2015/0364611 A1* | 12/2015 | Funch | H01L 28/86 |
| | | | 257/532 |
| 2017/0169958 A1* | 6/2017 | Zhou | H01G 11/86 |
| 2017/0213884 A1* | 7/2017 | Balakrishnan | H01L 28/86 |

\* cited by examiner

CAPACITOR AND MANUFACTURING METHOD THEREFOR

CROSS-REFERENCE TO RELATED APPLICATIONS

This application is a continuation of International Application No. PCT/CN2019/079677, filed on Mar. 26, 2019, the disclosure of which is hereby incorporated by reference in its entirety.

TECHNICAL FIELD

The present disclosure relates to the field of capacitors, and more particularly, to a capacitor and a manufacturing method therefor.

BACKGROUND

A capacitor can play a role of bypassing, filtering, decoupling, or the like in a circuit, which is an indispensable part of ensuring a normal operation of the circuit. With the continuous development of modern electronic system towards multi-function, high integration, low power consumption and miniaturization, traditional multi-layer ceramic capacitors (MLCCs) have been unable to meet the increasingly stringent requirements of small volume and high capacity of applications. How to produce a capacitor with small volume and high capacity has become an urgent technical problem to be resolved.

SUMMARY

The present disclosure provides a capacitor and a manufacturing method therefor, which can manufacture a capacitor with small volume and high capacitance density.

In a first aspect, provided is a capacitor, the capacitor including:

at least one multi-wing structure including N axis(axes) and M wings, where the N axis(axes) extends along a first direction, and the M wings are a convex structure formed by extending from a side wall(s) of the N axis(axes) toward a direction perpendicular to the first direction, a first wing of the M wings and the N axis(axes) are formed of a first conductive material, and a wing of the M wings other than the first wing is formed of a second conductive material, where M is an integer greater than or equal to 2, and N is a positive integer;

a conductive structure cladding the multi-wing structure;

a dielectric layer disposed between the multi-wing structure and the conductive structure to isolate the multi-wing structure from the conductive structure;

at least one first external electrode, where each first external electrode of the at least one first external electrode is electrically connected to some or all multi-wing structure(s) of the at least one multi-wing structure; and at least one second external electrode, where the second external electrode is electrically connected to the conductive structure.

Therefore, in the capacitor provided by the embodiment of the present disclosure, the multi-wing structure is used to increase a surface area, and a larger capacitance value can be obtained under the condition of a smaller device size, thereby increasing capacitance density of the capacitor.

In some possible implementation manners, the capacitor further includes: a substrate disposed under the multi-wing structure, and the dielectric layer is disposed between the conductive structure and the substrate to isolate the conductive structure from the substrate.

In some possible implementation manners, the conductive structure is complementary to the multi-wing structure in profile.

In some possible implementation manners, the dielectric layer is conformal to the multi-wing structure.

In some possible implementation manners, the capacitor further includes:

an isolation ring located outside the at least one multi-wing structure, where the isolation ring is disposed in the conductive structure and enters into the conductive structure along the first direction from an upper surface of the conductive structure to isolate the conductive structure into a first region and a second region, and the second external electrode is only electrically connected to the conductive structure in the first region.

It should be noted that at an edge of the capacitor, due to insufficient insulation capacity of air, air breakdown is prone to occur between the conductive structure and the substrate, which leads to a decrease in performance of the capacitor. The arrangement of the isolation ring can make the conductive structure in the second region not constitute an electrode plate of the capacitor, thereby avoiding a problem of air breakdown between the conductive structure and the substrate at the edge of the capacitor.

In some possible implementation manners, the N axis (axes) of the multi-wing structure enters into the substrate along the first direction from an upper surface of the substrate.

It should be noted that the N axis(axes) enters into the substrate downward from the upper surface of the substrate, which can increase mechanical stability of the multi-wing structure.

In some possible implementation manners, the conductive structure enters into the substrate along the first direction from an upper surface of the substrate.

It should be noted that the conductive structure enters into the substrate downward from the upper surface of the substrate, which can increase mechanical stability of the multi-wing structure. Further, when the substrate is a low-resistivity substrate, a surface area of an electrode plate constituting a capacitor can be further increased, thereby increasing capacitance density.

In some possible implementation manners, the capacitor further includes: a first insulating layer, where the first insulating layer is disposed between the substrate and the multi-wing structure to isolate the substrate from the multi-wing structure, and the first insulating layer is disposed between the conductive structure and the substrate to isolate the conductive structure from the substrate.

It should be noted that the first insulating layer can strengthen insulation between the multi-wing structure and the substrate, strengthen insulation between the conductive structure and the substrate, and can avoid a problem of air breakdown between the conductive structure and the substrate at an edge of the capacitor.

In some possible implementation manners, the capacitor further includes: a first conductive layer disposed between the first insulating layer and the substrate, where the N axis(axes) of the multi-wing structure penetrates through the first insulating layer along the first direction from an upper surface of the first insulating layer and is electrically connected to the first conductive layer.

In some possible implementation manners, the capacitor further includes: an electrode layer disposed on the conductive structure, where the electrode layer includes at least one first conductive region and at least one second conductive region that are separated from each other, the first conductive region forms the first external electrode, and the second conductive region forms the second external electrode.

In some possible implementation manners, the substrate is a low-resistivity substrate, the first external electrode is disposed under the substrate, and the second external electrode is disposed on the conductive structure.

In some possible implementation manners, the capacitor further includes: a second insulating layer disposed under the multi-wing structure, where the N axis(axes) of the multi-wing structure penetrates through the second insulating layer along the first direction from an upper surface of the second insulating layer, the first external electrode is disposed under the second insulating layer, and the second external electrode is disposed on the conductive structure.

In some possible implementation manners, a sacrificial material is provided in a region between different wings of the M wings that is close to the axis(axes).

In some possible implementation manners, the sacrificial material includes at least one of the following:
silicon, silicon oxide, silicon nitride, silicon-containing glass, carbon, or an organic polymer.

In some possible implementation manners, the first wing is located above the remaining wing(s) of the M wings.

In some possible implementation manners, the first external electrode is electrically connected to some or all the multi-wing structure(s) of the at least one multi-wing structure through at least one first via structure.

In some possible implementation manners, the second external electrode is electrically connected to the conductive structure through at least one second via structure.

In some possible implementation manners, the capacitor further includes: an interconnection structure for electrically connecting the first external electrode to some or all the multi-wing structure(s) of the at least one multi-wing structure.

In some possible implementation manners, the first conductive material and/or the second conductive material includes at least one of the following:
heavily doped polysilicon, metal silicide, carbon, conductive polymer, aluminum, copper, nickel, tantalum nitride, titanium nitride, titanium aluminum nitride, tantalum silicon nitride, or tantalum carbon nitride.

In some possible implementation manners, each wing of the multi-wing structure includes at least one of the following:
a heavily doped polysilicon layer, a metal silicide layer, a carbon layer, a conductive polymer layer, an aluminum layer, a copper layer, a nickel layer, a tantalum nitride layer, a titanium nitride layer, a titanium aluminum nitride layer, a tantalum silicon nitride layer, or a tantalum carbon nitride layer.

In some possible implementation manners, a material of the conductive structure includes at least one of the following:
heavily doped polysilicon, metal silicide, carbon, conductive polymer, aluminum, copper, nickel, tantalum nitride (TaN), titanium nitride (TiN), titanium aluminum nitride (TiAlN), tantalum silicon nitride (TaSiN), or tantalum carbon nitride (TaCN).

In some possible implementation manners, the dielectric layer includes at least one of the following:
a silicon oxide layer, a silicon nitride layer, a silicon oxynitride layer, a metal oxide layer, a metal nitride layer, or a metal oxynitride layer.

In the second aspect, provided is a method for manufacturing a capacitor, including:
producing a laminated structure on a substrate, where the laminated structure includes (M-1) second conductive material layer(s) and (M-1) sacrificial material layer(s), the (M-1) second conductive material layer(s) and the (M-1) sacrificial material layer(s) form a structure that a second conductive material layer and a sacrificial material layer are adjacent to each other, and the second conductive material layer is in direct contact with the substrate, where M is an integer greater than or equal to 2;
producing at least one first trench on the laminated structure, where the first trench extends into the laminated structure along a first direction from an upper surface of the laminated structure;
depositing a first conductive material on the laminated structure and in the at least one first trench to form a first structure;
producing at least one second trench on the first structure, where the second trench extends into the laminated structure along the first direction from an upper surface of the first structure to expose the (M-1) sacrificial material layer(s), and the second trench is located outside the first trench;
removing some or all sacrificial material layer(s) exposed in the second trench to form at least one multi-wing structure including M wings and N axis(axes), where the N axis(axes) extends along the first direction, the M wings are convex structures formed by extending from a side wall(s) of the N axis(axes) toward a direction perpendicular to the first direction, a first wing of the M wings and the N axis(axes) are formed of a first conductive material, and a wing of the M wings other than the first wing is formed of a second conductive material, where N is a positive integer;
depositing a dielectric layer on a surface of the multi-wing structure;
filling a third conductive material on the multi-wing structure and in the second trench to form a conductive structure, where the conductive structure dads the multi-wing structure, and the dielectric layer isolates the multi-wing structure from the conductive structure; and
producing at least one first external electrode and at least one second external electrode, where each first external electrode of the at least one first external electrode is electrically connected to some or all multi-wing structure(s) of the at least one multi-wing structure, and the at least one second external electrode is electrically connected to the conductive structure.

Therefore, in the method for manufacturing the capacitor provided by the embodiment of the present disclosure, a capacitance value of the capacitor can be increased by producing the multi-wing structure.

Optionally, the laminated structure is etched by deep reactive ion etching (DRIE) to form the at least one first trench in the laminated structure.

Optionally, the first structure is etched by DRIE to form the at least one second trench in the first structure.

In some possible implementation manners, the method further includes:
producing an isolation ring, where the isolation ring is located outside the at least one multi-wing structure, and the isolation ring is disposed in the conductive structure and extends into the conductive structure along the first direction from an upper surface of the conductive structure to isolate the conductive structure into a first region and a second region, and the second external electrode is only electrically connected to the conductive structure in the first region.

In some possible implementation manners, the first trench and/or the second trench further extends into the substrate along the first direction.

In some possible implementation manners, the substrate includes a first insulating layer and a base, the first insulating layer is located on the base, and the first insulating layer isolates the base from the multi-wing structure and isolates the conductive structure from the base.

In some possible implementation manners, the substrate includes a first insulating layer, a first conductive layer and a base, the first insulating layer is located on the base, and the first conductive layer is located between the first insulating layer and the base, where the N axis(axes) of the multi-wing structure penetrates through the first insulating layer along the first direction from an upper surface of the first insulating layer and is electrically connected to the first conductive layer.

In some possible implementation manners, the producing the at least one first external electrode and the at least one second external electrode includes:

producing an electrode layer on the conductive structure, where the electrode layer includes at least one first conductive region and at least one second conductive region that are separated from each other, the first conductive region forms the first external electrode, and the second conductive region forms the second external electrode.

In some possible implementation manners, the substrate is a low-resistivity substrate; and the producing the at least one first external electrode and the at least one second external electrode includes:

producing the at least one first external electrode under the substrate, and producing the at least one second external electrode on the conductive structure.

In some possible implementation manners, the substrate includes a second insulating layer and a base, and the N axis(axes) of the multi-wing structure penetrates through the second insulating layer along the first direction from an upper surface of the second insulating layer; and the producing the at least one first external electrode and the at least one second external electrode includes:

removing the base to expose the N axis(axes); and producing the at least one first external electrode under the second insulating layer, and producing the at least one second external electrode on the conductive structure.

In some possible implementation manners, the method further includes:

producing at least one first via structure so that the first external electrode is electrically connected to some or all the multi-wing structure(s) of the at least one multi-wing structure through the at least one first via structure.

In some possible implementation manners, the method further includes:

producing at least one second via structure so that the second external electrode is electrically connected to the conductive structure through the at least one second via structure.

In some possible implementation manners, the method further includes:

producing an interconnection structure so that the first external electrode is electrically connected to some or all the multi-wing structure(s) of the at least one multi-wing structure.

DESCRIPTION OF EMBODIMENTS

Technical solutions in embodiments of the present disclosure will be described hereinafter with reference to the accompanying drawings.

It should be understood that a capacitor of an embodiment of the present disclosure can play a role of bypassing, filtering, decoupling, or the like in a circuit.

The capacitor described in the embodiment of the present disclosure may be a 3D silicon capacitor which is a novel capacitor based on semiconductor wafer processing techniques. Compared with a traditional MLCC (multi-layer ceramic capacitor), the 3D silicon capacitor has advantages of small size, high precision, strong stability, and long lifetime. In a basic processing flow, a 3D structure with a high aspect ratio such as a via, a trench, a pillar, a wall, or the like is required to be first processed on a wafer or a substrate, and then an insulating film and a low-resistivity conductive material are deposited on a surface of the 3D structure to manufacture a lower electrode, a dielectric layer and an upper electrode of a capacitor, sequentially.

A 3D silicon capacitor at current stage draws on the concept of multi-layer nesting in DRAM manufacturing. By alternately depositing conductor and insulator materials on a surface of a 3D structure to manufacture a structure of multiple capacitors stacked vertically, then connecting all the capacitors in parallel on a front face of a silicon substrate in different connection methods, a capacitor with a large capacitance value is finally formed. However, current capacitance density of a wafer-level 3D capacitor is still limited.

In this context, the present disclosure proposes a novel capacitor structure and a manufacturing method therefor, which can improve capacitance density of the capacitor.

Hereinafter, a capacitor according to an embodiment of the present disclosure will be introduced in detail with reference to FIGS. 1 to 14.

It should be understood that capacitors in FIGS. 1 to 14 are merely examples, and the number of multi-wing structures included in a capacitor is not limited to that included in the capacitors as shown in FIGS. 1 to 14, and may be determined according to actual needs. Meanwhile, the number of wings and the number of axes included in a multi-wing structure are only examples, and the number of wings and the number of axes included in the multi-wing structure are not limited to those in the capacitors as shown in FIGS. 1 to 14, and may be determined according to actual needs.

It should be noted that, for convenience of understanding, in embodiments shown below, for structures shown in different embodiments, the same structures are denoted by the same reference numbers, and a detailed explanation for the same structures is omitted for brevity.

Figure 1:
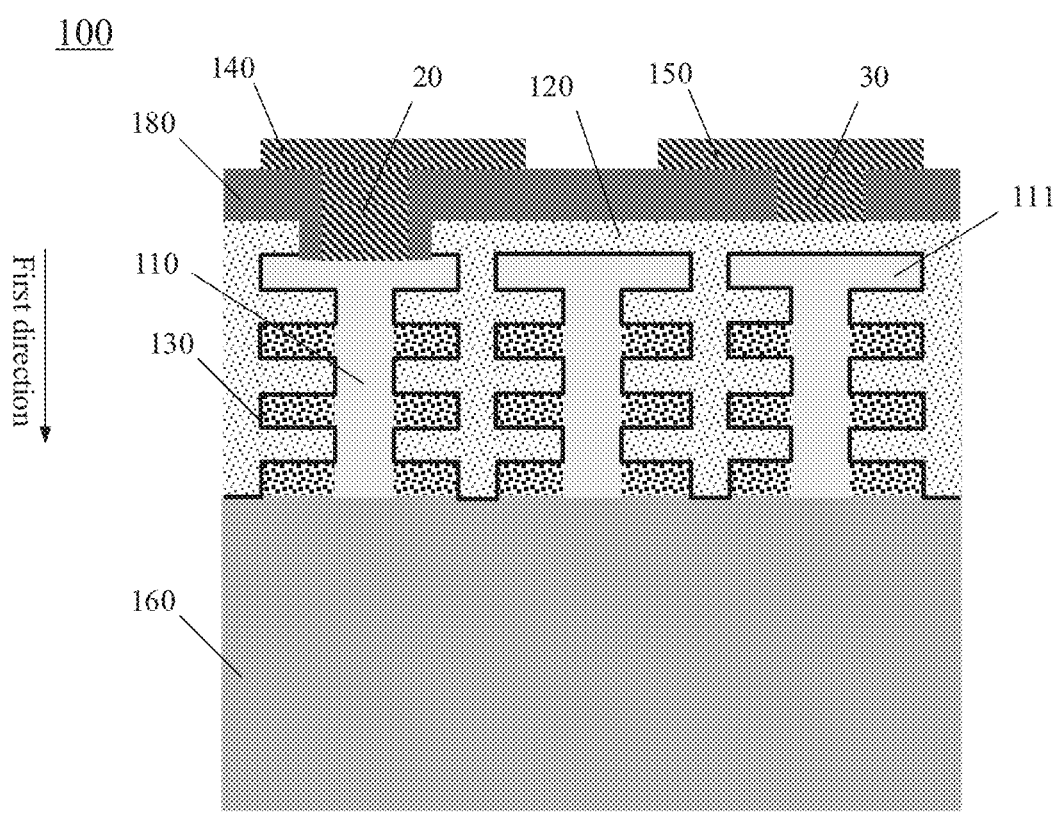
FIG. 1 is a schematic structural diagram of a capacitor according to an embodiment of the present disclosure.

FIG. 1 is a possible structural diagram of a capacitor 100 according to an embodiment of the present disclosure. As shown in FIG. 1, the capacitor 100 includes at least one multi-wing structure 110, a conductive structure 120, a dielectric layer 130, at least one first external electrode 140, and at least one second external electrode 150.

Specifically, as shown in FIG. 1, in the capacitor 100, the multi-wing structure 110 includes N axis(axes) and M wings, where the N axis(axes) extends along a first direction, and the M wings are a convex structure formed by extending from a side wall(s) of the N axis(axes) toward a direction perpendicular to the first direction, a first wing 111 of the M wings and the N axis(axes) are formed of a first conductive material, and a wing of the M wings other than the first wing 111 is formed of a second conductive material, where M is an integer greater than or equal to 2, and N is a positive integer; the conductive structure 120 dads the multi-wing structure 110; the dielectric layer 130 is disposed between the multi-wing structure 110 and the conductive structure 120 to isolate the multi-wing structure 110 from the conductive structure 120; each first external electrode 140 of the at least one first external electrode 140 is electrically connected to some or all multi-wing structure(s) 110 of the at least one multi-wing structure 110; and the second external electrode 150 is electrically connected to the conductive structure 120.

Optionally, the conductive structure 120 is complementary to the multi-wing structure 110 in profile. For example, as shown in FIG. 1, the conductive structure 120 may be structurally complementary to the multi-wing structure 110, and a combination of the two can form a structure with no internal gap or cavity, which improves structural integrity and mechanical stability of the capacitor.

Optionally, the dielectric layer 130 is conformal to the multi-wing structure 110. For example, as shown in FIG. 1, the dielectric layer 130 may have the same or substantially the same outline as the multi-wing structure 110, so that the dielectric layer 130 can clad a region on the multi-wing structure 110 that is in contact with the conductive structure 120. Therefore, the multi-wing structure 110 is more effectively isolated from the conductive structure 120.

Optionally, the first wing 111 is located above the remaining wing(s) of the M wings. That is, the first wing 111 is the uppermost wing among the M wings.

That is, in the embodiment of the present disclosure, specific values of M and N may be flexibly configured according to actual needs.

In the embodiment of the present disclosure, the multi-wing structure is used to increase a surface area, and a larger capacitance value can be obtained under the condition of a smaller device size, thereby increasing capacitance density of the capacitor.

It should be noted that in the embodiment of the present disclosure, since each first external electrode 140 is electrically connected to some or all the multi-wing structure(s) 110 of the at least one multi-wing structure 110, the multi-wing structure 110 and the conductive structure 120 may establish a variety of series and parallel relationships.

As an example, it is assumed that the capacitor 100 includes three multi-wing structures and two first external electrodes, where the three multi-wing structures are denoted as a multi-wing structure A, a multi-wing structure B, and a multi-wing structure C, respectively; and the two first external electrodes are denoted as a first external electrode P and a first external electrode Q, respectively.

If the first external electrode P is electrically connected to the multi-wing structure A and the multi-wing structure B, and the first external electrode Q is electrically connected to the multi-wing structure C, then the multi-wing structure A and the conductive structure form a capacitor 1, and a capacitance value is denoted as C1; the multi-wing structure B and the conductive structure form a capacitor 2, and a capacitance value is denoted as C2; the capacitor 1 and the capacitor 2 are connected in parallel, and a capacitance value of an equivalent capacitor i is denoted as Ci, and thus Ci=C1+C2; the multi-wing structure C and the conductive structure form a capacitor 3, and a capacitance value is denoted as C3; and the equivalent capacitor i is connected in series with the capacitor 3, and a capacitance value of an equivalent capacitor j is denoted as Cj, and thus Cj=C3*Ci/(C3+Ci).

If the first external electrode P is electrically connected to the multi-wing structure A, the multi-wing structure B and the multi-wing structure C, and the first external electrode Q is also electrically connected to the multi-wing structure A, the multi-wing structure B and the multi-wing structure C, then for capacitors corresponding to the first external electrode P and the second external electrode, the multi-wing structure A and the conductive structure form a capacitor 1, and a capacitance value is denoted as C1; the multi-wing structure B and the conductive structure form a capacitor 2, and a capacitance value is denoted as C2; the multi-wing structure C and the conductive structure form a capacitor 3, and a capacitance value is denoted as C3; and the capacitor 1, the capacitor 2 and the capacitor 3 are connected in parallel, and a capacitance value of an equivalent capacitor i is denoted as Ci, and thus Ci=C1+C2+C3; and for capacitors corresponding to the first external electrode Q and the second external electrode, the multi-wing structure A and the conductive structure form a capacitor 4, and a capacitance value is denoted as C4; the multi-wing structure B and the conductive structure form a capacitor 5, and a capacitance value is denoted as C5; the multi-wing structure C and the conductive structure form a capacitor 6, and a capacitance value is denoted as C6; the capacitor 4, the capacitor 5 and the capacitor 6 are connected in parallel, and a capacitance value of an equivalent capacitor j is denoted as Cj, and thus Cj=C4+C5+C6; and the equivalent capacitor i is connected in series with the equivalent capacitor j, and a capacitance value of an equivalent capacitor is denoted as C, and thus C=Ci*Cj/(Ci+Cj).

As another example, it is assumed that the capacitor 100 includes three multi-wing structures and one first external electrode, where the three multi-wing structures are denoted as a multi-wing structure A, a multi-wing structure B, and a multi-wing structure C, respectively.

If the first external electrode is electrically connected to the multi-wing structure A and the multi-wing structure B, then the multi-wing structure A and the conductive structure form a capacitor 1, and a capacitance value is denoted as C1; the multi-wing structure B and the conductive structure form a capacitor 2, and a capacitance value is denoted as C2; the capacitor 1 and the capacitor 2 are connected in parallel, and a capacitance value of an equivalent capacitor i is denoted as Ci, and thus Ci=C1+C2; and the multi-wing structure C does not constitute an electrode plate of the capacitor.

If the first external electrode is electrically connected to the multi-wing structure A, the multi-wing structure B and the multi-wing structure C, the multi-wing structure A and the conductive structure form a capacitor 1, and a capacitance value is denoted as C1; the multi-wing structure B and the conductive structure form a capacitor 2, and a capacitance value is denoted as C2; the multi-wing structure C and the conductive structure form a capacitor 3, and a capacitance value is denoted as C3; and the capacitor 1, the capacitor 2 and the capacitor 3 are connected in parallel, and a capacitance value of an equivalent capacitor i is denoted as Ci, and thus Ci=C1+C2+C3.

Optionally, in the embodiment of the present disclosure, the capacitor 100 further includes: a substrate 160 disposed under the multi-wing structure 110, and the dielectric layer 130 is disposed between the conductive structure 120 and the substrate 160 to isolate the conductive structure 120 from the substrate 160.

Optionally, the first direction may be a direction perpendicular to the substrate 160, for example, as shown in FIG. 1.

Optionally, in the embodiment of the present disclosure, the substrate 160 may be a silicon wafer, including monocrystalline silicon, polycrystalline silicon, or amorphous silicon. The substrate 160 may also be other semiconductor substrates, including an SOI wafer or a III-V group compound semiconductor wafer formed of silicon carbide (SiC), gallium nitride (GaN), gallium arsenide (GaAs), or the like, or may be a glass substrate, or may be an organic polymer substrate, or may be a substrate with a surface containing an epitaxial layer, an oxide layer, or a doped layer.

In the embodiment of the present disclosure, a projection of the multi-wing structure 110 on the substrate 160 may take a variety of forms, and may be a regular pattern, such as an oblong, a rectangle, a circle, etc., but it is not limited to this, and may also be an irregular pattern. Similarly, the multi-wing structure 110 may also be a variety of 3D structures, such as structures shown in FIG. 2, FIG. 3, and FIG. 4, but it is not limited thereto.

It should be noted that in the embodiment of the present disclosure, a thickness of the substrate 160 may also be flexibly set according to actual needs. For example, when the substrate 160 is too thick to meet the requirements, the substrate 160 can be thinned.

It should be noted that FIG. 1 in the embodiment of the present disclosure is a section along a longitudinal direction of the substrate.

It should be understood that the external electrodes in the embodiment of the present disclosure may also be referred to as pads or external pads.

Optionally, the first external electrode 140 and the second external electrode 150 may adopt various conductive materials, such as metal copper.

Optionally, in the embodiment of the present disclosure, the first conductive material and/or the second conductive material includes but is not limited to at least one of the following:

heavily doped polysilicon, metal silicide, carbon, conductive polymer, aluminum, copper, nickel, tantalum nitride, titanium nitride, titanium aluminum nitride, tantalum silicon nitride, or tantalum carbon nitride.

That is, the first conductive material and/or the second conductive material may be heavily doped polysilicon, metal silicide, carbon, conductive polymer, metals such as Al, Cu, Ni, or the like, low-resistivity compounds such as TaN, TiN, TiAlN, TaSiN, TaCN, or the like, or a combination or laminated structure of the above materials.

It should be noted that the first conductive material and the second conductive material may be the same or different. Preferably, the first conductive material is different from the second conductive material.

Optionally, in the embodiment of the present disclosure, a material of the conductive structure 120 includes but is not limited to at least one of the following: heavily doped polysilicon, metal silicide, carbon, conductive polymer, aluminum, copper, nickel, tantalum nitride (TaN), titanium nitride (TiN), titanium aluminum nitride (TiAlN), tantalum silicon nitride (TaSiN), or tantalum carbon nitride (TaCN).

Optionally, in the embodiment of the present disclosure, each wing of the multi-wing structure 110 includes but is not limited to at least one of the following:

a heavily doped polysilicon layer, a metal silicide layer, a carbon layer, a conductive polymer layer, an aluminum layer, a copper layer, a nickel layer, a tantalum nitride layer, a titanium nitride layer, a titanium aluminum nitride layer, a tantalum silicon nitride layer, or a tantalum carbon nitride layer.

Optionally, in the embodiment of the present disclosure, the dielectric layer 130 includes at least one of the following:

a silicon oxide layer, a silicon nitride layer, a silicon oxynitride layer, a metal oxide layer, a metal nitride layer, or a metal oxynitride layer.

That is, the dielectric layer 130 may be an insulating material, or a combination or laminated layer of multiple insulating materials, such as silicon dioxide, silicon nitride, SiON, or a high dielectric constant material, including aluminum oxide, hafnium oxide, zirconium oxide, titanium oxide, $Y_2O_3$, $La_2O_3$, $HfSiO_4$, $LaAlO_3$, $SrTiO_3$, $LaLuO_3$, or the like. A specific insulating material and a layer thickness may be adjusted according to a capacitance value, a frequency characteristic, a loss and other requirements of a capacitor. Of course, the dielectric layer 130 may also include some other insulating materials, which is not limited in the embodiment of the present disclosure.

Optionally, in the embodiment of the present disclosure, the first external electrode 140 is electrically connected to some or all the multi-wing structure(s) 110 of the at least one multi-wing structure 110 through at least one first via structure 20.

It should be noted that the same material as the first external electrode 140 is provided in the at least one first via structure 20, so as to achieve the purpose that the first external electrode 140 is electrically connected to some or all the multi-wing structure(s) 110 of the at least one multi-wing structure 110. Of course, other conductive materials may also be provided in the at least one first via structure 20, so as to achieve the purpose that the first external electrode 140 is electrically connected to some or all the multi-wing structure(s) 110 of the at least one multi-wing structure 110.

It should be understood that the shape of the at least one first via structure 20 and the number thereof may be specifically determined according to a manufacturing process of the capacitor 100, which is not limited in the embodiment of the present disclosure.

Optionally, in the embodiment of the present disclosure, the second external electrode 150 is electrically connected to the conductive structure 120 through at least one second via structure 30.

It should be noted that the same material as the second external electrode 150 is provided in the at least one second via structure 30, so as to achieve the purpose that the second external electrode 150 is electrically connected to the conductive structure 120. Of course, other conductive materials may also be provided in the at least one second via structure 30, so as to achieve the purpose that the second external electrode 150 is electrically connected to the conductive structure 120.

It should be understood that the shape of the at least one second via structure 30 and the number thereof may be specifically determined according to a manufacturing process of the capacitor 100, which is not limited in the embodiment of the present disclosure.

Optionally, in the embodiment of the present disclosure, the capacitor 100 further includes an interconnection structure for electrically connecting the first external electrode 140 to some or all the multi-wing structure(s) 110 of the at least one multi-wing structure 110.

Optionally, in the embodiment of the present disclosure, it is assumed that M=4 and N=1, as shown in FIG. 1, the multi-wing structure 110 may include four wings and one axis, where the uppermost wing is a first wing 111, the first wing 111 and the axis are formed of a first conductive material, and the remaining wings are formed of a second conductive material. The conductive structure 120 clads the multi-wing structure 110, and the dielectric layer 130 is disposed between the conductive structure 120 and the multi-wing structure 110 to electrically isolate the conductive structure 120 from the multi-wing structure 110.

It should be noted that M=4 and N=1 are only examples. In the embodiment of the present disclosure, M may be an integer greater than or equal to 2, such as 5, 10, etc., which is not limited in the embodiment of the present disclosure.

Optionally, as shown in FIG. 1, the multi-wing structure 110 and the conductive structure 120 are disposed on the substrate 160, and the dielectric layer 130 is disposed between the conductive structure 120 and the substrate 160 to electrically isolate the conductive structure 120 from the substrate 160.

Optionally, in some embodiments, the at least one first external electrode 140 and the second external electrode 150 are disposed on the conductive structure 120. Optionally, the capacitor 100 further includes: an electrode layer disposed on the conductive structure 120, where the electrode layer includes at least one first conductive region and at least one second conductive region that are separated from each other, the first conductive region forms the first external electrode 140, and the second conductive region forms the second external electrode 150. That is, the at least one first external electrode 140 and the at least one second external electrode 150 can be formed by one etching, which reduces etching steps.

Optionally, the capacitor 100 further includes: an interlayer dielectric layer 180. Specifically, as shown in FIG. 1, the interlayer dielectric layer 180 is disposed on an upper surface of the conductive structure 120.

Specifically, as shown in FIG. 1, the electrode layer is disposed on the interlayer dielectric layer 180, and the first external electrode 140 is electrically connected to the multi-wing structure 110 through the first via structure 20, and the second external electrode 150 is electrically connected to the conductive structure 120 through the second via structure 30. Specifically, the first via structure 20 is disposed in the interlayer dielectric layer 180 and penetrates through the interlayer dielectric layer 180, and the same material as the electrode layer is provided in the first via structure 20, so that the first external electrode 140 is electrically connected to the multi-wing structure 110 through the first via structure 20; and the second via structure 30 is disposed in the interlayer dielectric layer 180 and penetrates through the interlayer dielectric layer 180, and the same material as the electrode layer is disposed in the second via structure 30 so that the second external electrode 150 is electrically connected to the conductive structure 120 through the second via structure 30.

It should be noted that the above FIG. 1 shows three multi-wing structures 110, and the first external electrode 140 is electrically connected to only one multi-wing structure 110 through the first via structure 20. Of course, in the embodiment of the present disclosure, the first external electrode 140 may be electrically connected to the three multi-wing structures 110 at the same time, or may also be electrically connected to two of the three multi-wing structures 110 at the same time, which is not limited in the embodiment of the present disclosure.

Optionally, if the substrate 160 is a low-resistivity substrate, the three multi-wing structures 110 may be electrically connected through the substrate 160, so that the first external electrode 140 is electrically connected to the three multi-wing structures 110 through the first via structure 20.

Optionally, a material of the interlayer dielectric layer 180 may be an organic polymer material, including polyimide, parylene, benzocyclobutene (BCB), or the like, or may be some inorganic materials, including spin on glass (SOG), undoped silicon glass (USG), boro-silicate glass (BSG), phospho-silicate glass (PSG), boro-phospho-silicate glass (BPSG), silicon oxide synthesized by tetraethyl orthosilicate (TEOS), silicon oxide, silicon nitride, or ceramic, or may also be a combination of the above materials.

Optionally, in some embodiments, the N axis(axes) of the multi-wing structure 110 extends into the substrate 160 along the first direction from an upper surface of the substrate 160. For example, as shown in FIG. 5, the N axis(axes) extends into the substrate 160 along the first direction from an upper surface of the substrate 160, so that mechanical stability of the multi-wing structure 110 can be increased.

Figure 5:
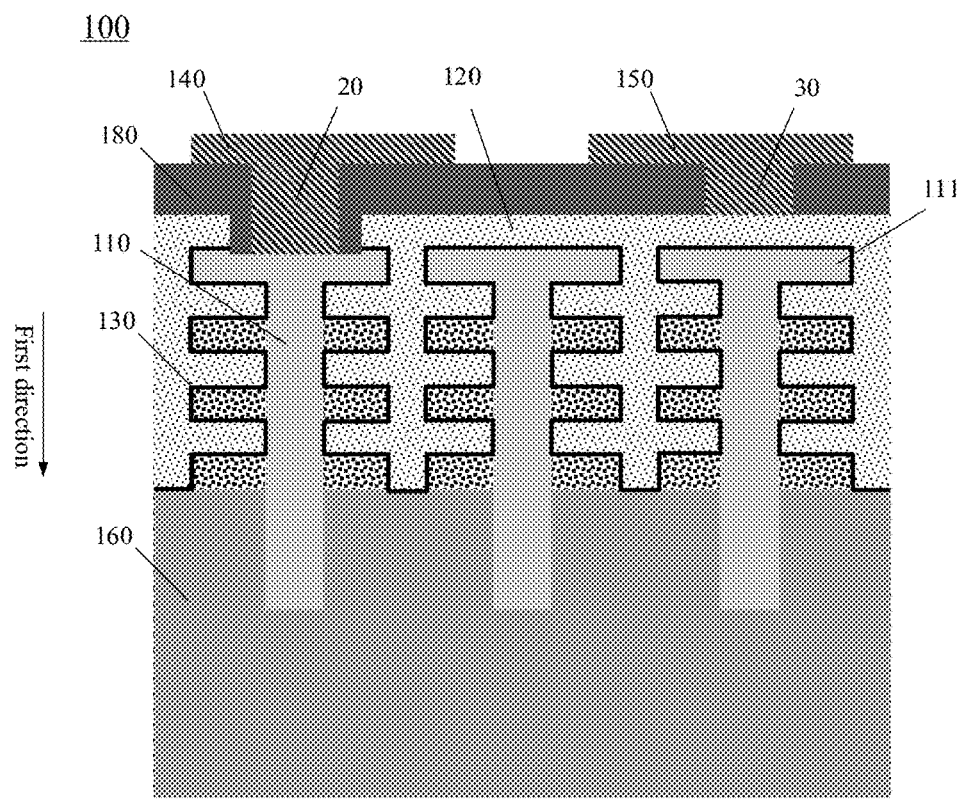
FIG. 5 is a schematic structural diagram of still another capacitor according to an embodiment of the present disclosure.

It should be understood that, except that setting of the multi-wing structure 110 is different, the other settings of FIG. 5 are the same as those of FIG. 1, and for the sake of brevity, details are not described again.

Figure 6:
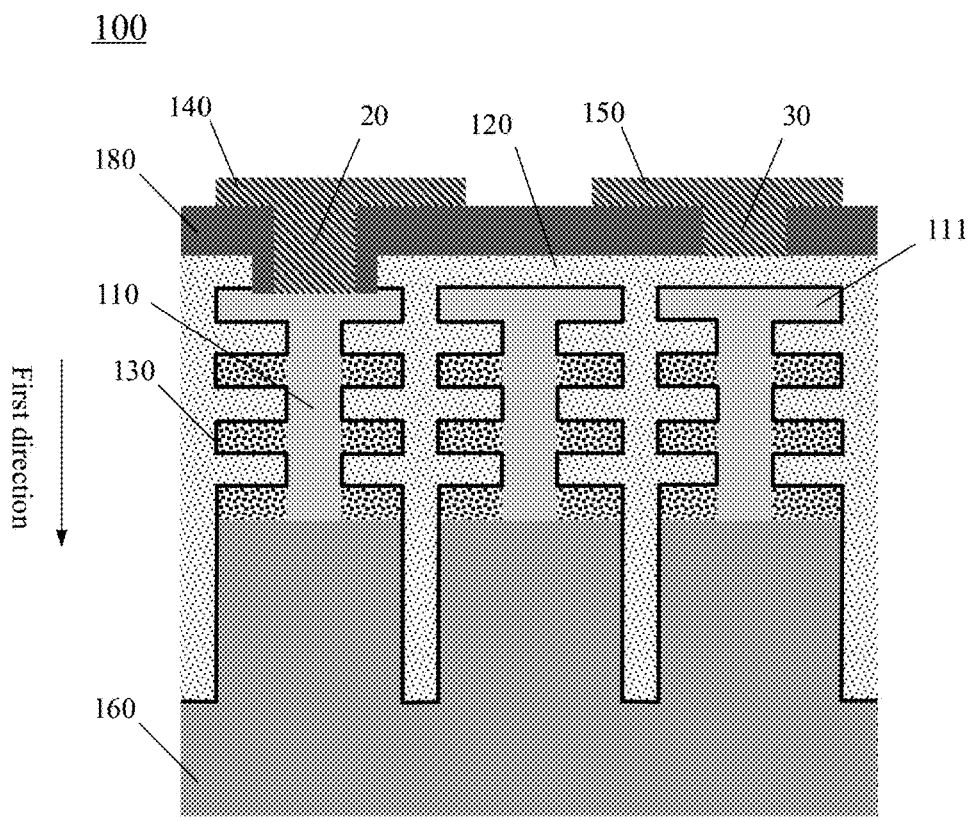
FIG. 6 is a schematic structural diagram of yet another capacitor according to an embodiment of the present disclosure.

Optionally, in some embodiments, the conductive structure 120 extends into the substrate 160 along the first direction from an upper surface of the substrate 160. For example, as shown in FIG. 6, the conductive structure 120 extends into the substrate 160 along the first direction from an upper surface of the substrate 160, which can increase mechanical stability of the multi-wing structure 110. Further, when the substrate 160 is a low-resistivity substrate, a surface area of an electrode plate constituting a capacitor can be further increased, thereby increasing capacitance density.

It should be understood that, except that setting of the conductive structure 120 is different, the other settings of FIG. 6 are the same as those of FIG. 1, and for the sake of brevity, details are not described again.

Optionally, in some embodiments, an insulating layer may be provided between the substrate 160 and the multi-wing structure 110 to strengthen insulation between the multi-wing structure 110 and the substrate 160, and to strengthen insulation between the conductive structure 120 and the substrate 160, which can avoid a problem of air breakdown between the conductive structure 120 and the substrate 160 at an edge of the capacitor.

Figure 7:
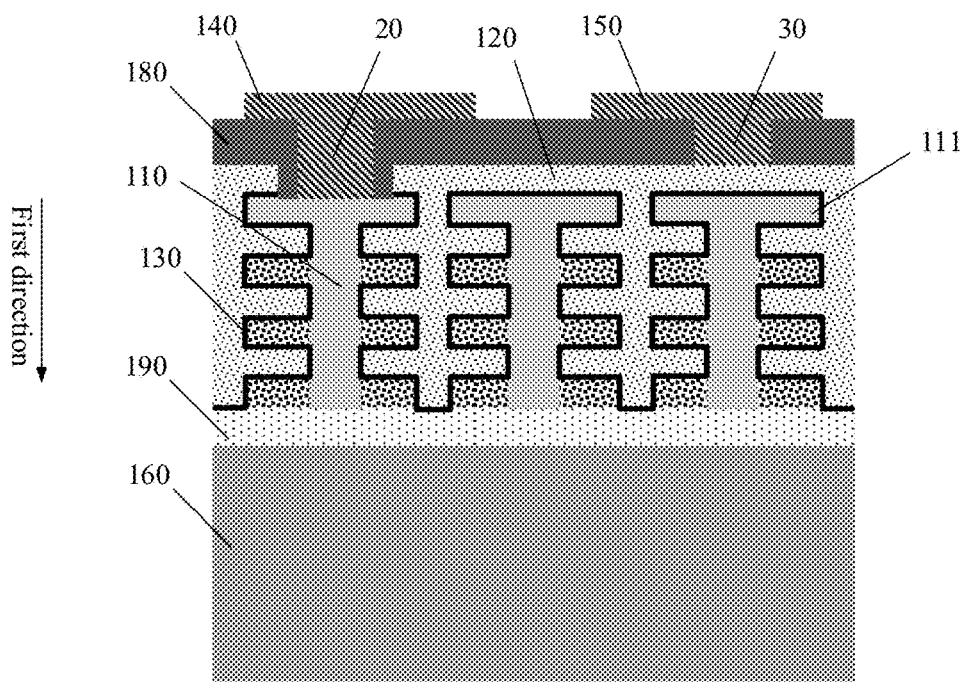
FIG. 7 is a schematic structural diagram of yet another capacitor according to an embodiment of the present disclosure.

Specifically, the capacitor 100 further includes: a first insulating layer 190. As shown in FIG. 7, the first insulating layer 190 is disposed between the substrate 160 and the multi-wing structure 110 to isolate the substrate 160 from the multi-wing structure 110, and the first insulating layer 190 is disposed between the conductive structure 120 and the substrate 160 to isolate the conductive structure 120 from the substrate 160.

Optionally, the substrate 160 may be a substrate having the first insulating layer 190, that is, the first insulating layer 190 may be contained in the substrate 160. For example, the substrate 160 includes the first insulating layer 190 and a base 161, and the first insulating layer 190 is located on the base 161.

Optionally, a material of the first insulating layer 190 may be an organic polymer material, including polyimide, parylene, benzocyclobutene (BCB), or the like, or may be some inorganic materials, including SOG, USG, BSG, PSG, BPSG, silicon oxide synthesized by TEOS, silicon oxide, silicon nitride, or ceramic, or may also be a combination of the above materials.

It should be understood that, except that the first insulating layer 190 is additionally provided, the other settings of FIG. 7 are the same as those of FIG. 1, and for the sake of brevity, details are not described again.

Figure 8:
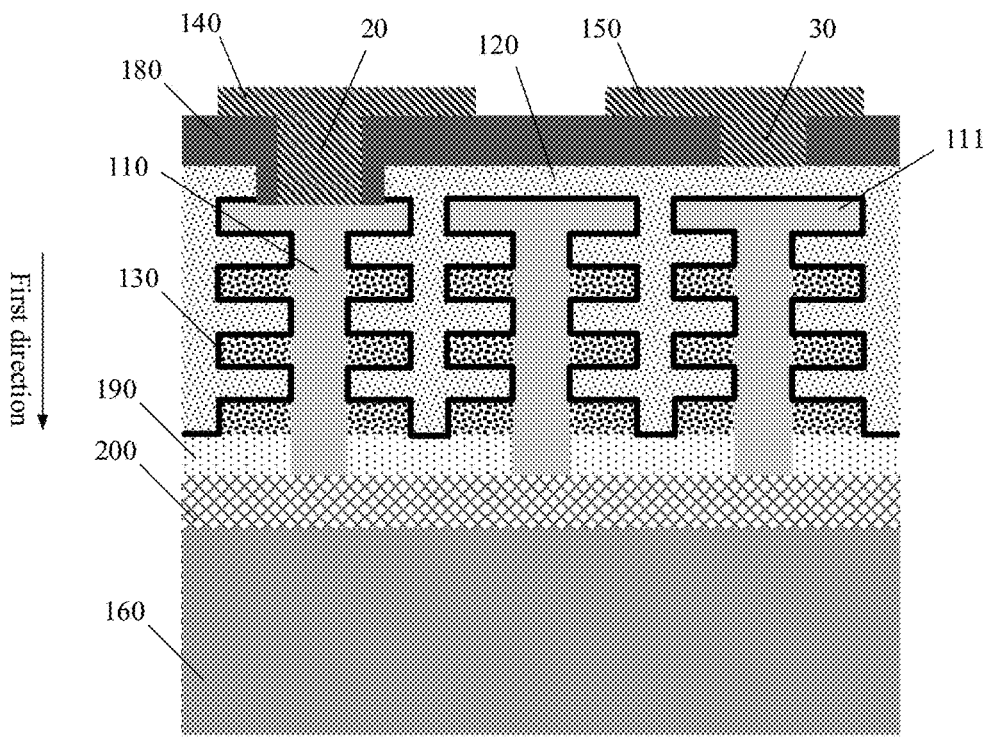
FIG. 8 is a schematic structural diagram of yet another capacitor according to an embodiment of the present disclosure.

Optionally, in some embodiments, the capacitor 100 further includes: a first insulating layer 190 and a first conductive layer 200, where as shown in FIG. 8, the first insulating layer 190 is disposed between the substrate 160 and the multi-wing structure 110 to isolate the substrate 160 from the multi-wing structure 110, and the first insulating layer 190 is disposed between the conductive structure 120 and the substrate 160 to isolate the conductive structure 120 from the substrate 160; and the first conductive layer 200 is disposed between the first insulating layer 190 and the substrate 160, where the N axis(axes) of the multi-wing structure 110 penetrates through the first insulating layer 190 along the first direction from an upper surface of the first insulating layer 190 and is electrically connected to the first conductive layer 200.

It should be noted that the first insulating layer 190 can also strengthen insulation between the multi-wing structure 110 and the substrate 160, strengthen insulation between the conductive structure 120 and the substrate 160, and can avoid a problem of air breakdown between the conductive structure 120 and the substrate 160 at an edge of the capacitor. In addition, setting of the first conductive layer 200 can further increase a surface area of an electrode plate constituting the capacitor, thereby increasing capacitance density.

Optionally, the substrate 160 may be a substrate having the first insulating layer 190 and the first conductive layer 200, that is, the first insulating layer 190 and the first conductive layer 200 may be contained in the substrate 160. For example, the substrate 160 includes the first insulating layer 190, the first conductive layer 200 and a base 161, the first insulating layer 190 is located on the base 161, and the first conductive layer 200 is located between the first insulating layer 190 and the base 161.

It should be understood that, except that the first insulating layer 190 and the first conductive layer 200 are additionally provided, and setting of the multi-wing structure 110 is different, the other settings of FIG. 8 are the same as those of FIG. 1, and for the sake of brevity, details are not described again.

Figure 9:
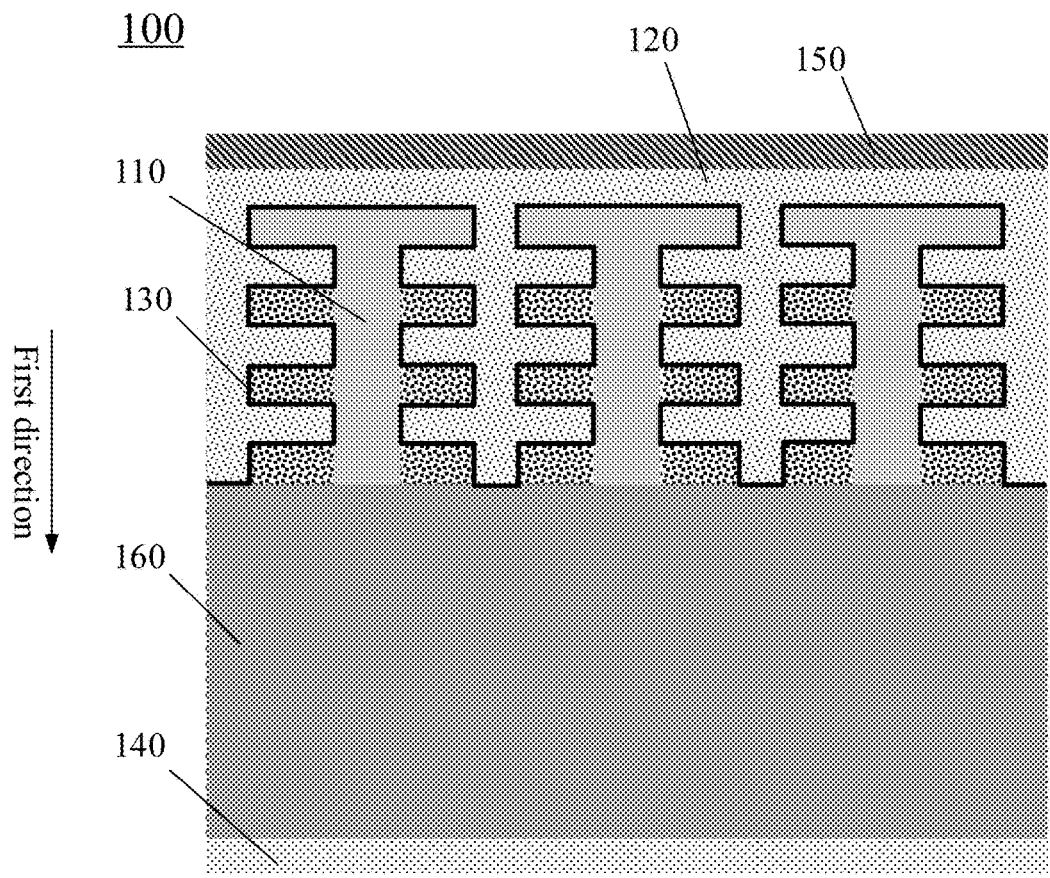
FIG. 9 is a schematic structural diagram of yet another capacitor according to an embodiment of the present disclosure.

Optionally, in the embodiment of the present disclosure, when the substrate 160 is a low-resistivity substrate, the first external electrode 140 is disposed under the substrate 160, and the second external electrode 150 is disposed on the conductive structure 120. Specifically, as shown in FIG. 9, the first external electrode 140 is disposed under the substrate 160, and the second external electrode 150 is disposed on the conductive structure 120. The first external electrode 140 is electrically connected to the multi-wing structure 110 through the substrate 160, that is, the first external electrode 140 is electrically connected to three multi-wing structures 110 shown in FIG. 9 at the same time, and the second external electrode 150 is electrically connected to the conductive structure 120 through direct contact.

It should be understood that, except that the interlayer dielectric layer 180 is not provided, and settings of the first external electrode 140 and the second external electrode 150 are different, the other settings of FIG. 9 are the same as those of FIG. 1, and for the sake of brevity, details are not described again.

It should be noted that in the capacitor 100 shown in FIG. 1, FIG. 5, FIG. 6 and FIG. 8, when the substrate 160 is a low-resistivity substrate, similar to those shown in FIG. 9, the first external electrode 140 may also be disposed under the substrate 160, and the second external electrode 150 may also be disposed on the conductive structure 120, and details are not described again.

Optionally, in an embodiment of the present disclosure, the capacitor 100 further includes: a second insulating layer 210 disposed under the multi-wing structure 110, where the N axis(axes) of the multi-wing structure 110 penetrates through the second insulating layer 210 along the first direction from an upper surface of the second insulating layer 210, the first external electrode 140 is disposed under the second insulating layer 210, and the second external electrode 150 is disposed on the conductive structure 120. Specifically, as shown in FIG. 10, the first external electrode 140 is electrically connected to the multi-wing structure 110, that is, the first external electrode 140 is electrically connected to three multi-wing structures 110 shown in FIG. 10 at the same time, and the second external electrode 150 is electrically connected to the conductive structure 120 through direct contact.

Optionally, a material of the second insulating layer 210 may be an organic polymer material, including polyimide, parylene, benzocyclobutene (BCB), or the like, or may be some inorganic materials, including SOG, USG, BSG, PSG, BPSG, silicon oxide synthesized by TEOS, silicon oxide, silicon nitride, or ceramic, or may also be a combination of the above materials.

Figure 10:
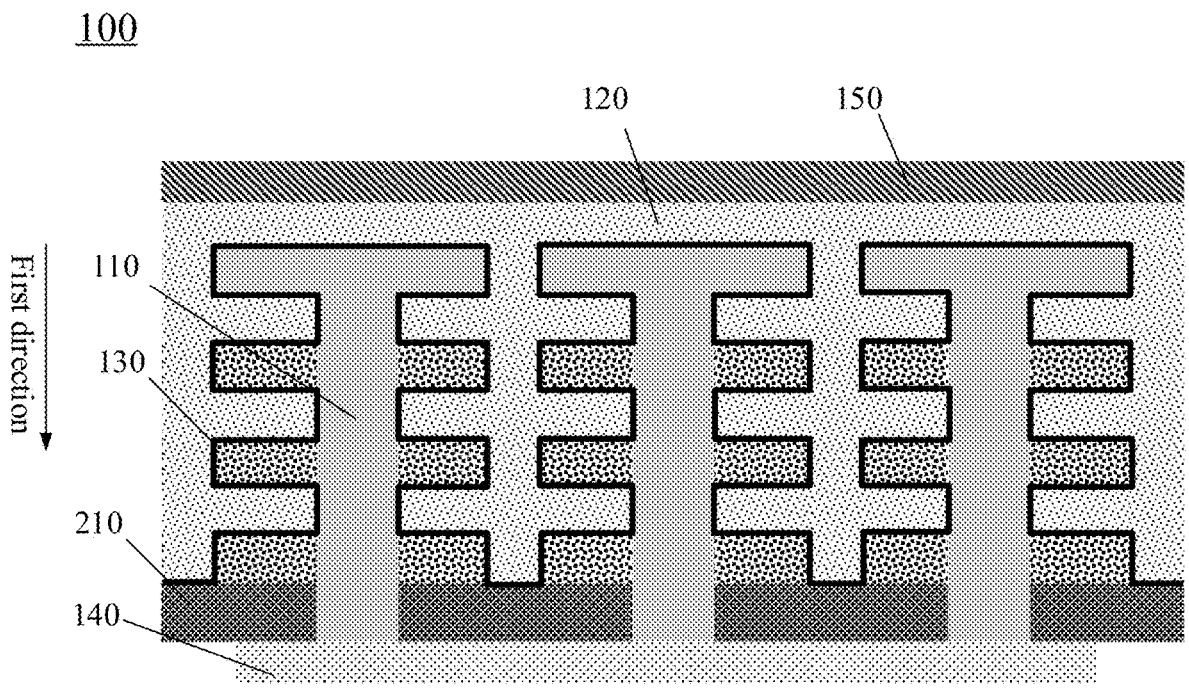
FIG. 10 is a schematic structural diagram of yet another capacitor according to an embodiment of the present disclosure.

It should be understood that, except that the substrate 160 is not provided, the second insulating layer 210 is additionally provided, and setting of the multi-wing structure 110 is different, the other settings of FIG. 10 are the same as those of FIG. 9, and for the sake of brevity, details are not described again.

Optionally, in an embodiment of the present disclosure, the capacitor 100 further includes: an isolation ring 220 located outside the at least one multi-wing structure 110, where the isolation ring 220 is disposed in the conductive structure 120 and extends into the conductive structure 120 along the first direction from an upper surface of the conductive structure 120 to isolate the conductive structure 120 into a first region 121 and a second region 122, and the second external electrode 150 is only electrically connected to the conductive structure 120 in the first region 121.

Optionally, the isolation ring 220 may have the same material as the interlayer dielectric layer 180. That is, a material of the isolation ring 220 may be an organic polymer material, including polyimide, parylene, benzocyclobutene (BCB), or the like, or may be some inorganic materials, including SOG, USG, BSG, PSG, BPSG, silicon oxide synthesized by TEOS, silicon oxide, silicon nitride, or ceramic, or may also be a combination of the above materials.

Figure 11:
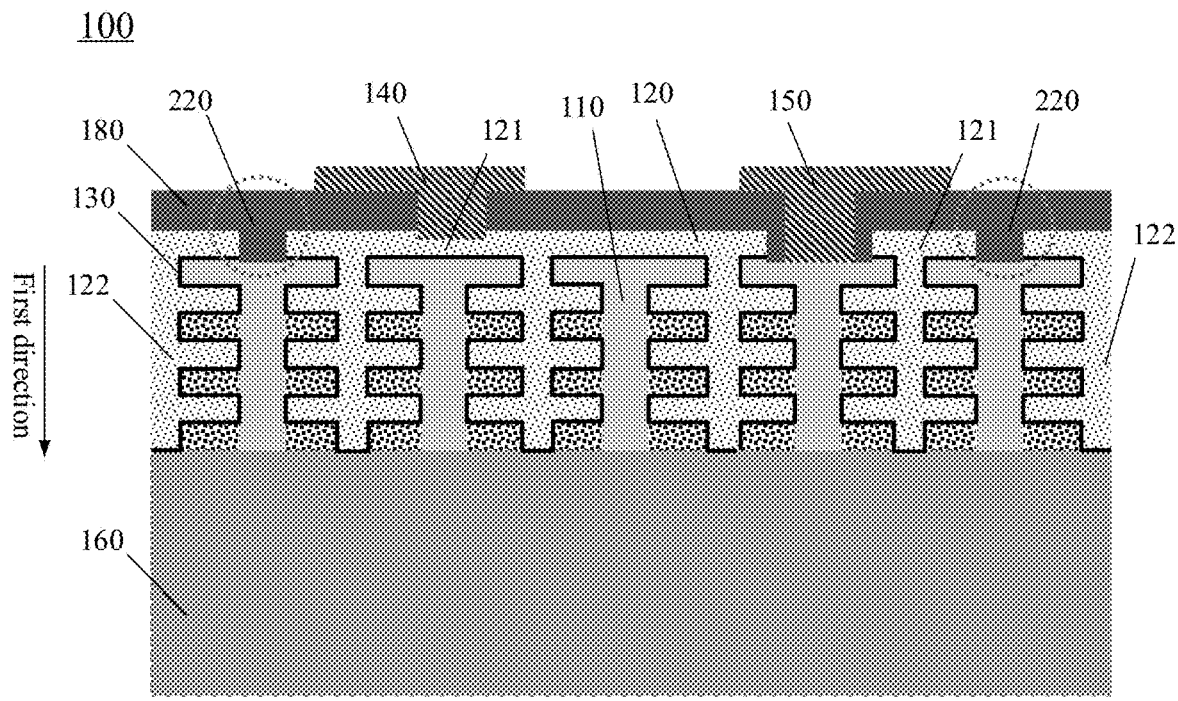
FIG. 11 is a schematic structural diagram of yet another capacitor according to an embodiment of the present disclosure.

For example, as shown in FIG. 11, the isolation ring 220 extends into some multi-wing structure(s) that is located at an edge of a capacitor chip and does not constitute an electrode plate of the capacitor 100 along the first direction, thereby isolating the conductive structure 120 into a first region 121 and a second region 122, and the second external electrode 150 is only electrically connected to the conductive structure 120 in the first region 121.

Figure 12:
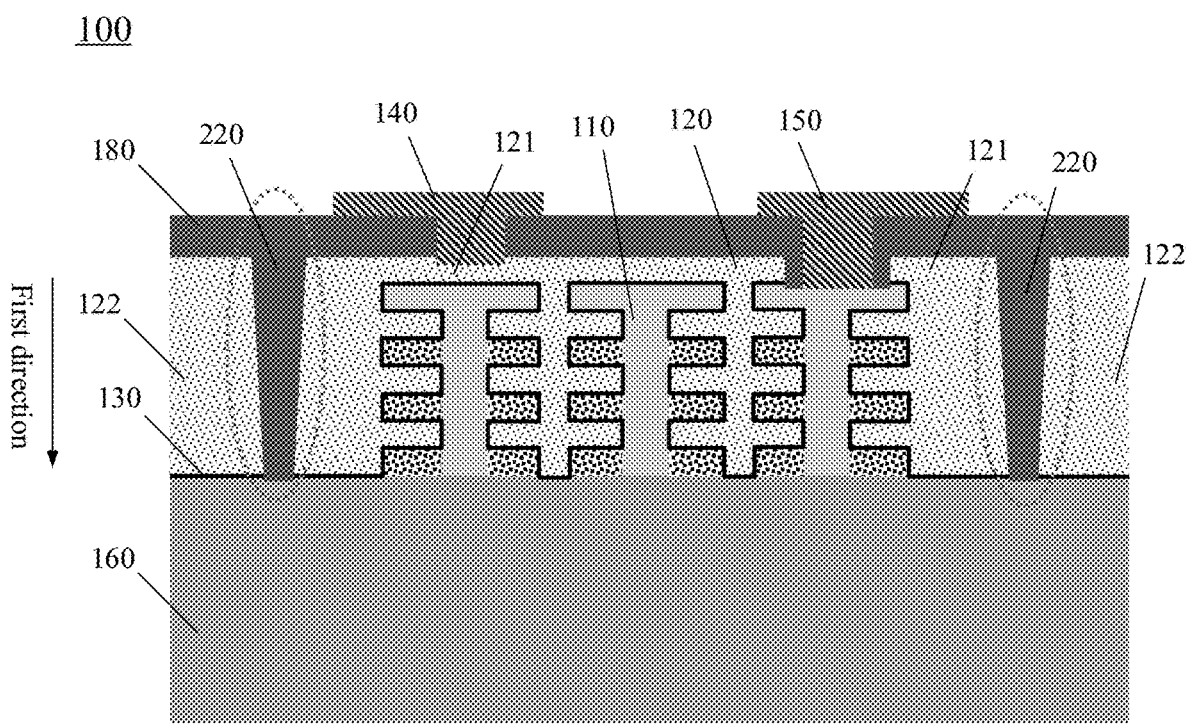
FIG. 12 is a schematic structural diagram of yet another capacitor according to an embodiment of the present disclosure.

For another example, as shown in FIG. 12, the isolation ring 220 extends into the substrate 160 along the first direction, thereby isolating the conductive structure 120 into a first region 121 and a second region 122, and the second external electrode 150 is only electrically connected to the conductive structure 120 in the first region 121.

Figure 13:
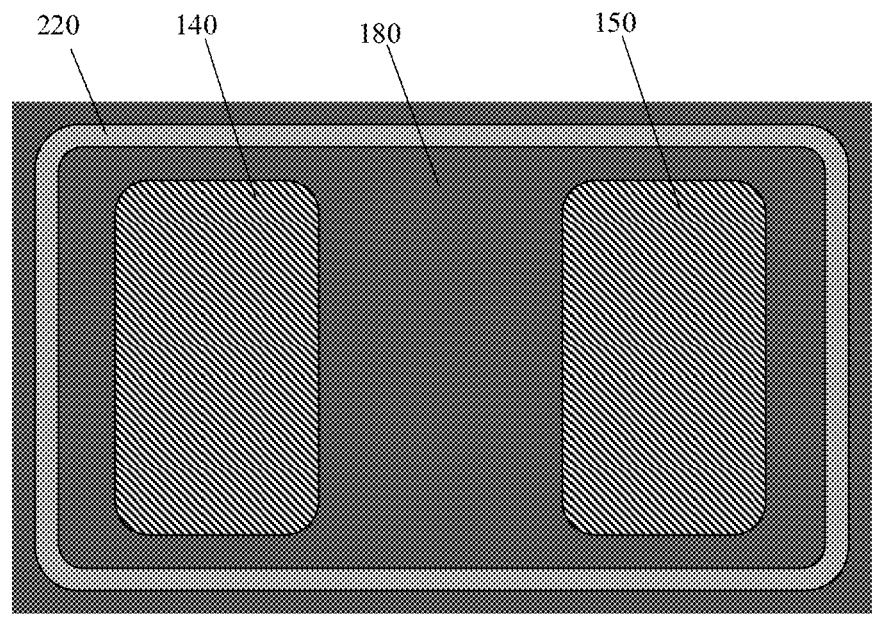
FIG. 13 is a schematic top view of an isolation ring according to an embodiment of the present disclosure.

Specifically, a top view of the isolation ring 220 may be as shown in FIG. 13.

It should be noted that at an edge of the capacitor 100 or the capacitor chip, due to insufficient insulation capacity of air, air breakdown is prone to occur between the conductive structure 120 and the substrate 160, which leads to a decrease in performance of the capacitor. The arrangement of the isolation ring 220 can make the conductive structure 120 in the second region 122 not constitute an electrode plate of the capacitor, thereby avoiding a problem of air breakdown between the conductive structure 120 and the substrate 160 at the edge of the capacitor.

Figure 14:
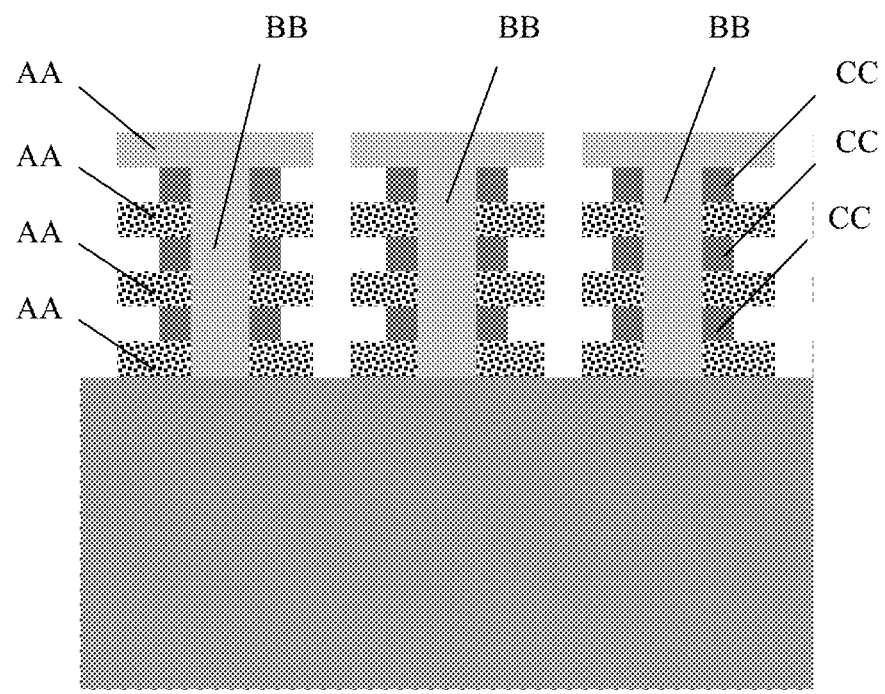
FIG. 14 is a schematic diagram of a sacrificial material filled between wings according to an embodiment of the present disclosure.

Optionally, in an embodiment of the present disclosure, a sacrificial material CC is provided in a region between different wings AA of the M wings AA that is close to an axis BB. As shown in FIG. 14, a region between different wings AA that is close to an axis BB is filled with a sacrificial material CC, so that mechanical stability of the multi-wing structure 110 can be enhanced.

Optionally, the sacrificial material includes at least one of the following: silicon, silicon oxide, silicon nitride, silicon-containing glass, carbon, or organic polymer.

In other words, the sacrificial material may be silicon, silicon oxide, silicon nitride, silicon-containing glass (USG, BSG, PSG, or BPSG), carbon, organic polymer, or other materials that may be selectively removed.

Therefore, in the capacitor provided by the embodiment of the present disclosure, the multi-wing structure is used to increase a surface area, and a larger capacitance value can be obtained under the condition of a smaller device size, thereby increasing capacitance density of the capacitor.

A capacitor according to an embodiment of the present disclosure is described above, and a method for manufacturing a capacitor according to an embodiment of the present disclosure will be described below. The capacitor of the foregoing embodiment of the present disclosure can be manufactured by the method for manufacturing the capacitor of the embodiment of the present disclosure, and related descriptions in the following embodiments and the foregoing embodiments may refer to each other.

Hereinafter, a method for manufacturing a capacitor according to an embodiment of the present disclosure will be introduced in detail with reference to FIGS. 15 to 16.

Figure 15:
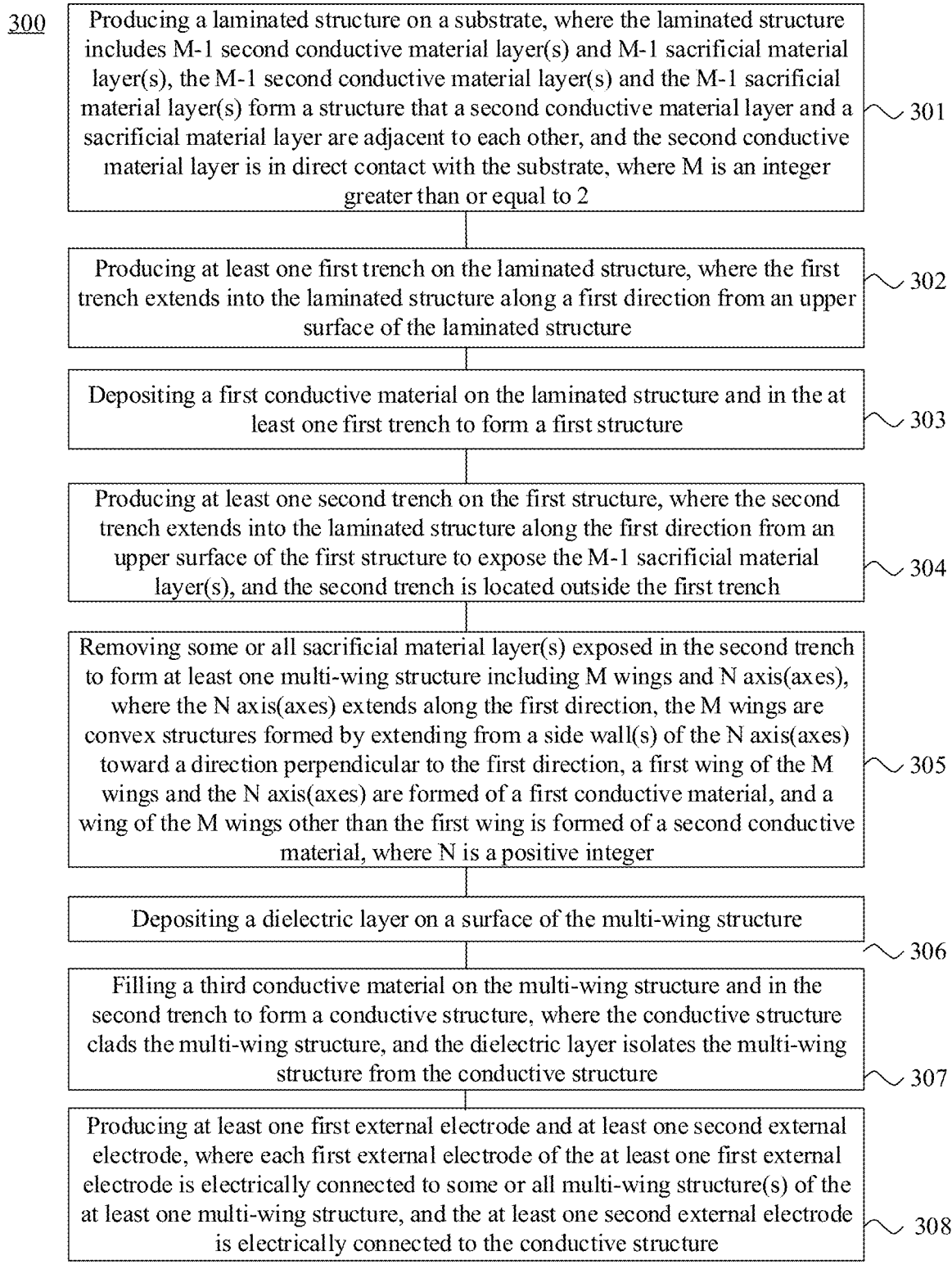
FIG. 15 is a schematic flow chart of a method for manufacturing a capacitor according to an embodiment of the present disclosure.

It should be understood that FIGS. 15 to 16 are schematic flow charts of a method for manufacturing a capacitor according to an embodiment of the present disclosure, but these steps or operations are merely examples, and other operations or variations of various operations in FIGS. 15 to 16 may also be performed in the embodiment of the present disclosure.

FIG. 15 illustrates a schematic flow chart of a method 300 for manufacturing a capacitor according to an embodiment of the present disclosure. As shown in FIG. 15, the method 300 for manufacturing the capacitor includes the following steps.

Step 301, a laminated structure is produced on a substrate, where the laminated structure includes (M-1) second conductive material layer(s) and (M-1) sacrificial material layer(s), the (M-1) second conductive material layer(s) and the (M-1) sacrificial material layer(s) form a structure that a second conductive material layer and a sacrificial material layer are adjacent to each other, and the second conductive material layer is in direct contact with the substrate, where M is an integer greater than or equal to 2.

Optionally, the laminated structure may be formed on the substrate 160 by various processes such as spin coating, spray coating, thermal oxidation, epitaxy, physical vapor deposition (PVD), chemical vapor deposition (CVD), atomic layer deposition (ALD), or the like.

Figure 16A:
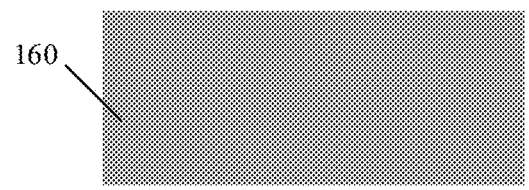
FIGS. 16a to 16t are schematic diagrams of a method for manufacturing a capacitor according to an embodiment of the present disclosure.
Figure 16B:
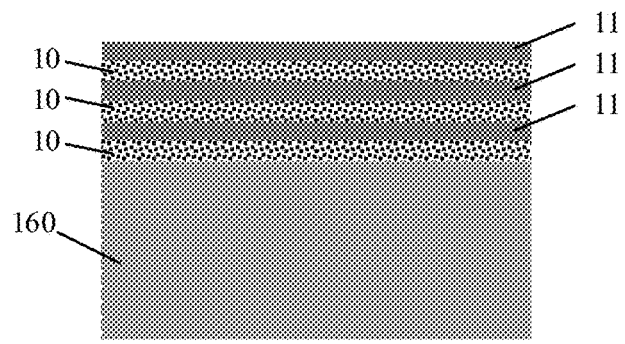

Specifically, it is assumed that M=4, and a second conductive material layer 10, a sacrificial material layer 11, a second conductive material layer 10, a sacrificial material layer 11, a second conductive material layer 10 and a sacrificial material layer 11 are sequentially deposited on a substrate 160 as shown in FIG. 16a by a CVD process to form a laminated structure on the substrate 160, as shown in FIG. 16b. For example, the second conductive material is polysilicon heavily doped with boron, and the sacrificial material is BSG. Specific thicknesses of the second conductive material layer 10 and the sacrificial material layer 11 may be adjusted according to a capacitance value, a frequency characteristic, a loss and other requirements of a capacitor.

Optionally, the second conductive material layer 10 includes but is not limited to at least one of the following:
a heavily doped polysilicon layer, a metal silicide layer, a carbon layer, a conductive polymer layer, an aluminum layer, a copper layer, a nickel layer, a tantalum nitride layer, a titanium nitride layer, a titanium aluminum nitride layer, a tantalum silicon nitride layer, or a tantalum carbon nitride layer.

That is, the second conductive material layer 10 may be heavily doped polysilicon, metal silicide, carbon, conductive polymer, metals such as Al, Cu, Ni, or the like, low-resistivity compounds such as TaN, TiN, TiAlN, TaSiN, TaCN, or the like, or a combination or laminated structure of the above materials.

Step 302, at least one first trench is produced on the laminated structure, where the first trench extends into the laminated structure along a first direction from an upper surface of the laminated structure.

Figure 16C:
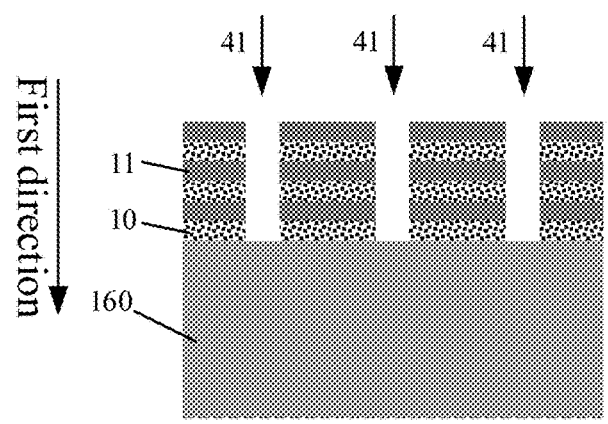

Specifically, in a structure as shown in FIG. 16b, a layer of photoresist is spin-coated on an upper surface of the laminated structure; then, a number of photoresist notches are opened after exposure and development; then, the laminated structure that is not covered with the photoresist is removed by a dry etching process to form three first trenches 41; finally, the photoresist is removed, as shown in FIG. 16c.

It should be noted that the first trench 41 has a depth along a normal direction of a surface of the substrate 160, that is, the first direction is perpendicular to the substrate 160, or the first trench 41 is perpendicular to the substrate 160. A projection of the first trench 41 on the surface of the substrate 160 may be any geometry figure.

Step 303, a first conductive material is deposited on the laminated structure and in the at least one first trench to form a first structure.

Figure 16D:
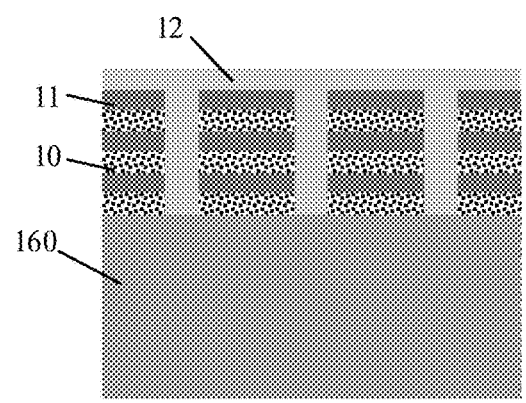

Specifically, a first conductive material 12 is deposited on the upper surface of the laminated structure and an inner surface of the first trench 41 to form a first structure, as shown in FIG. 16d.

It should be noted that the deposition method of the first conductive material 12 may refer to the deposition method for forming the laminated structure, and details are not described herein again.

Step 304, at least one second trench is produced on the first structure, where the second trench extends into the laminated structure along the first direction from an upper surface of the first structure to expose the (M-1) sacrificial material layer(s), and the second trench is located outside the first trench.

Figure 16E:
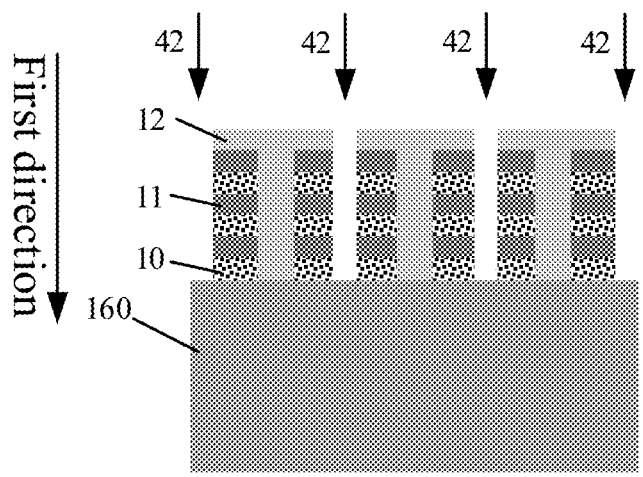

Specifically, first, in a structure as shown in FIG. 16d, a layer of photoresist is spin-coated on an upper surface of the first structure; then, a number of photoresist notches are opened after exposure and development; then, the first structure that is not covered with the photoresist is removed by a dry etching process to form four second trenches 42 and expose the (M-1) sacrificial material layer(s) in the second trenches 42; finally, the photoresist is removed, as shown in FIG. 16e.

It should be noted that the second trench 42 is located outside the first trench 41, that is, the second trench 42 cannot be located in the first trench 41, and cannot have an overlapping region with the first trench 41.

Step 305, some or all sacrificial material layer(s) exposed in the second trench is removed to form at least one multi-wing structure including M wings and N axis(axes), where the N axis(axes) extends along the first direction, the M wings are convex structures formed by extending from a side wall(s) of the N axis(axes) toward a direction perpendicular to the first direction, a first wing of the M wings and the N axis(axes) are formed of a first conductive material, and a wing of the M wings other than the first wing is formed of a second conductive material, where N is a positive integer.

Optionally, the conductive structure 120 is complementary to the multi-wing structure 110 in profile.

Optionally, the dielectric layer 130 is conformal to the multi-wing structure 110.

Figure 16F:
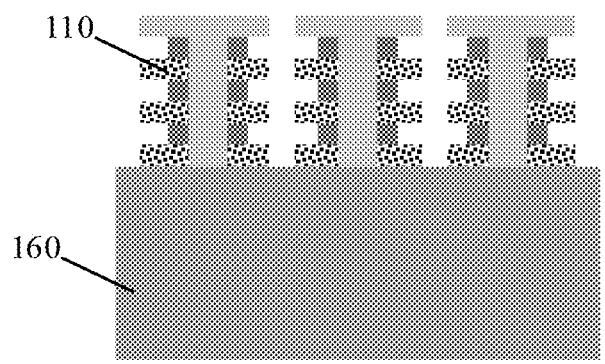
Figure 16G:
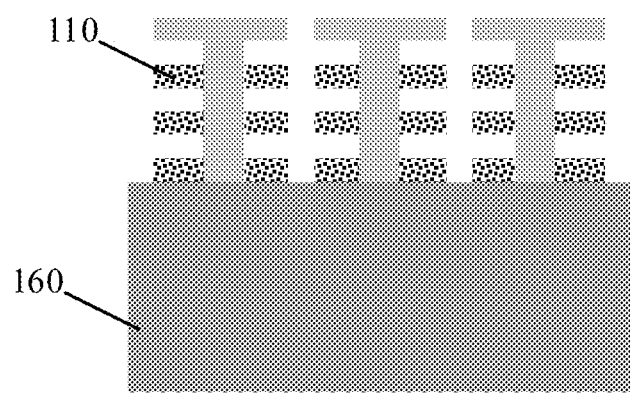

Specifically, in a structure as shown in FIG. 16e, it is assumed that the sacrificial material is BSG, the second trench 42 is used as a release hole, and a hydrofluoric acid solution or gaseous hydrofluoric acid is passed into the second trench 42 as a corrosive agent, and some sacrificial material layers (BSG) exposed in the second trench are removed to form three multi-wing structures 110, as shown in FIG. 16f. Alternatively, a hydrofluoric acid solution or gaseous hydrofluoric acid is passed into the second trench 42 as a corrosive agent to remove all sacrificial material layers (BSG) exposed in the second trench to form three multi-wing structures 110, as shown in FIG. 16g.

The following takes the removal of all the sacrificial material layers exposed in the second trench as an example for description.

Figure 2:
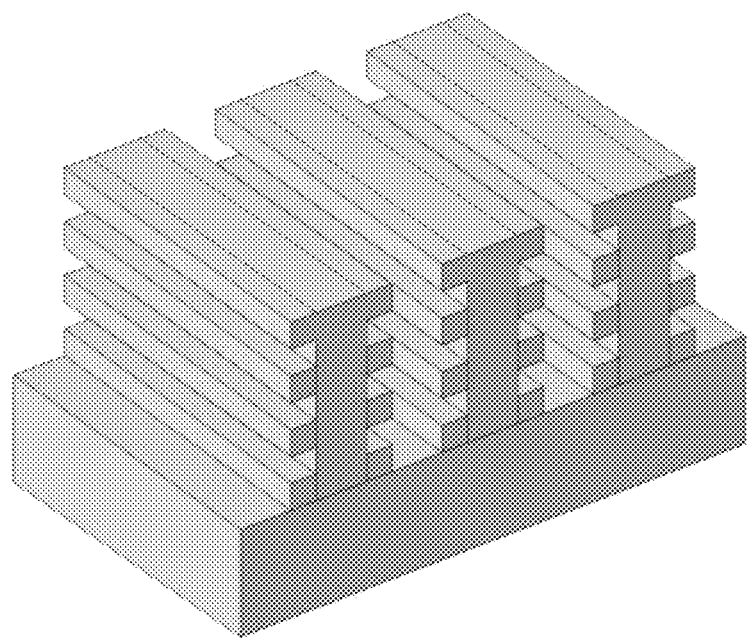
FIG. 2 is a schematic structural diagram of a multi-wing structure according to an embodiment of the present disclosure.
Figure 3:
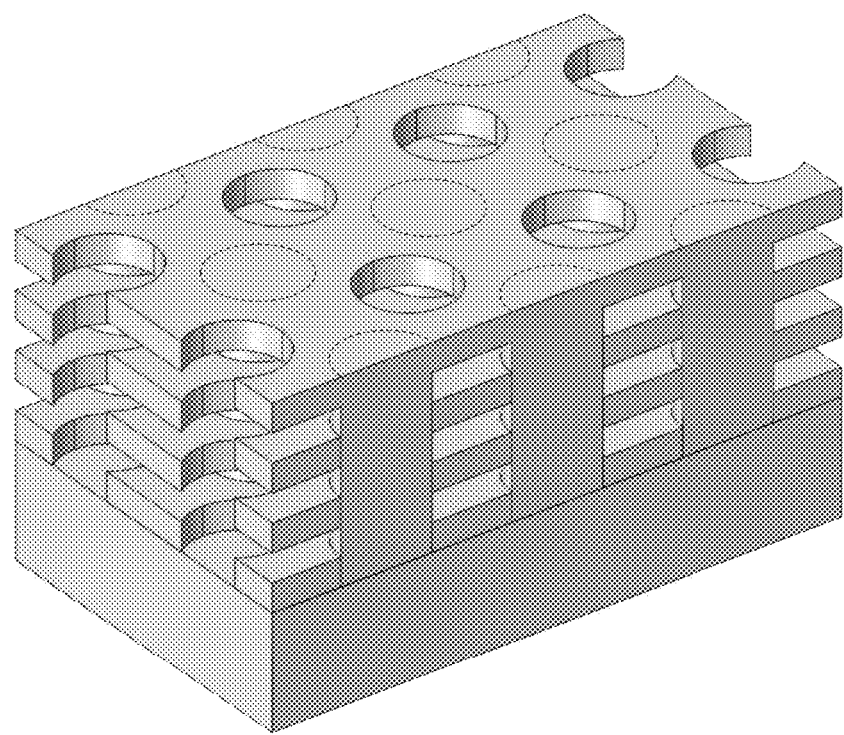
FIG. 3 is a schematic structural diagram of another multi-wing structure according to an embodiment of the present disclosure.
Figure 4:
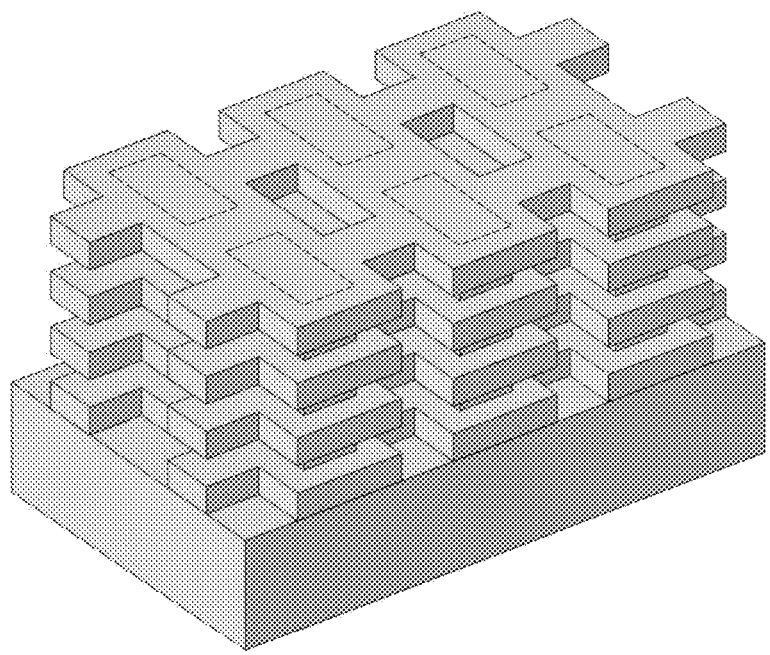
FIG. 4 is a schematic structural diagram of yet another multi-wing structure according to an embodiment of the present disclosure.

It should be noted that projections of the first trench 41 and the second trench 42 on the substrate 160 may take a variety of forms, and thus the three-dimensional shape of the multi-wing structure 110 also has many possibilities, for example, as shown in FIGS. 2, 3 and 4, but is not limited thereto.

Step 306, a dielectric layer is deposited on a surface of the multi-wing structure.

Specifically, in a structure as shown in FIG. 16g, an insulating material is deposited (or grown) on a surface of the multi-wing structure 110 to form a dielectric layer 130, as shown in FIG. 6h. A specific thickness of the dielectric layer 130 may be adjusted according to a capacitance value, a frequency characteristic, a loss and other requirements of a capacitor.

The deposition method of the dielectric layer 130 may be one or more of thermal oxidation, ALD, and low pressure chemical vapor deposition (LPCVD).

Step 307, a third conductive material is filled on the multi-wing structure and in the second trench to form a conductive structure, where the conductive structure dads the multi-wing structure, and the dielectric layer isolates the multi-wing structure from the conductive structure.

Figure 16H:
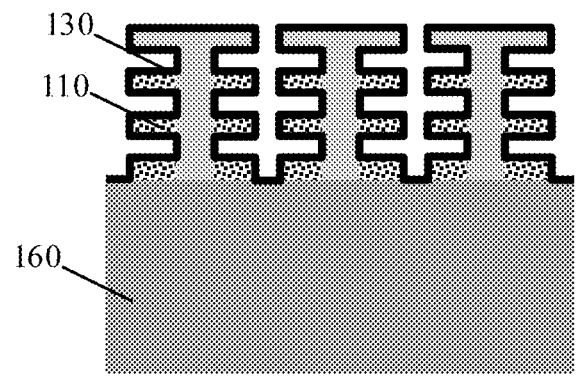
Figure 16I:
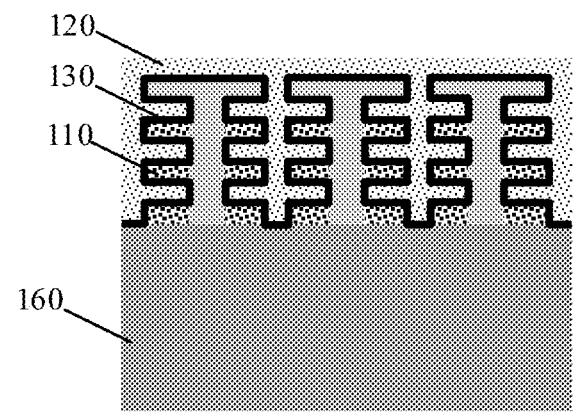

Specifically, in a structure as shown in FIG. 16h, a third conductive material is filled on the multi-wing structure and an inner surface of the second trench to form a conductive structure 120, where the conductive structure 120 dads the multi-wing structure 110, and the dielectric layer 130 isolates the multi-wing structure 110 from the conductive structure 120, as shown in FIG. 16i.

Step 308, at least one first external electrode and at least one second external electrode are produced, where each first external electrode of the at least one first external electrode is electrically connected to some or all multi-wing structure(s) of the at least one multi-wing structure, and the at least one second external electrode is electrically connected to the conductive structure.

Specifically, based on the above steps 301-308, capacitors as shown in FIG. 1, FIG. 5, FIG. 6, FIG. 7, FIG. 8, FIG. 9, FIG. 10, FIG. 11, and FIG. 12 can be produced.

It should be understood that an upper surface of each material layer in steps 301-308 refers to a surface of the material layer substantially parallel to the upper surface of the substrate, and an inner surface of each material layer refers to an upper surface of the material layer in the trench. The upper surface and the inner surface may be regarded as a whole.

Optionally, in some embodiments, the method 300 further includes:

producing at least one first via structure 20 so that the first external electrode 140 is electrically connected to some or all the multi-wing structure(s) 110 of the at least one multi-wing structure 110 through the at least one first via structure 20.

Optionally, in some embodiments, the method 300 further includes:

producing at least one second via structure 30 so that the second external electrode 150 is electrically connected to the conductive structure 120 through the at least one second via structure 30.

Optionally, in some embodiments, the method 300 further includes:

producing an interconnection structure so that the first external electrode 140 is electrically connected to some or all the multi-wing structure(s) 110 of the at least one multi-wing structure 110.

Optionally, in some embodiments, the method 300 further includes:

performing photolithography processing on the conductive structure 120 to form at least one window structure 50 and expose the first conductive material in the multi-wing structure 110; and depositing an interlayer dielectric layer 180 on an upper surface of the conductive structure 120 and in the at least one window structure 50.

Figure 16J:
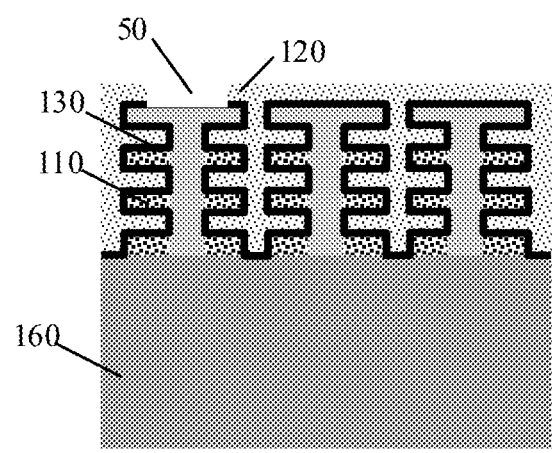

Specifically, in a structure as shown in FIG. 16i, first, photolithography processing is performed on the conductive structure 120 to form a window structure 50, as shown in FIG. 16j. Then, an insulating material is deposited on an upper surface of the conductive structure 120 and in the at least one window structure 50 to form an interlayer dielectric layer 180, and photolithography processing is performed on the interlayer dielectric layer 180 to form a first via structure 20 and expose the first conductive material in the multi-wing structure 110, and form a second via structure 30 and expose the conductive structure 120, as shown in FIG. 16k.

Optionally, in some embodiments, the producing the at least one first external electrode and the at least one second external electrode (step 308) includes:

producing an electrode layer on the conductive structure 120, where the electrode layer includes at least one first conductive region and at least one second conductive region that are separated from each other, the first conductive region forms the first external electrode 140, and the second conductive region forms the second external electrode 150.

Figure 16K:
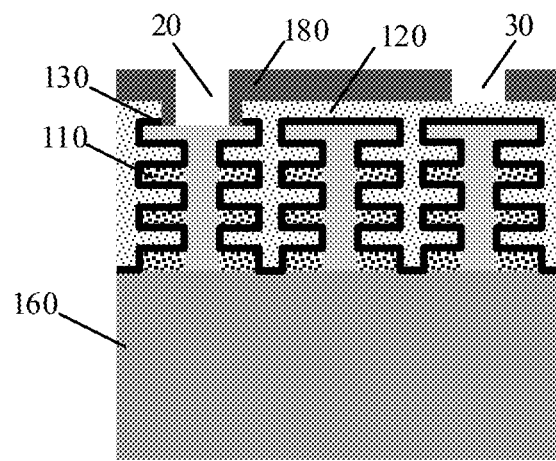

Specifically, in a structure as shown in FIG. 16k, an electrode material is deposited in the window structure 50 and the upper surface of the conductive structure 120 to form an electrode layer; then, photolithography processing is performed on the electrode layer to form at least one first conductive region and at least one second conductive region that are separated from each other, the first conductive region forms the first external electrode 140, and the second conductive region forms the second external electrode 150. Therefore, the capacitor as shown in FIG. 1 can be produced.

Optionally, in some embodiments, the first trench 41 and/or the second trench 42 also extends downward into the substrate 160.

Specifically, in the case that the first trench 41 also extends downward into the substrate 160, that is, the axis (axes) of the multi-wing structure 110 also extends into the substrate 160 along the first direction, the capacitor as shown in FIG. 5 can be produced.

Specifically, in the case that the second trench 42 also extends into the substrate 160 along the first direction, that is, the conductive structure 120 also extends into the substrate 160 along the first direction, the capacitor as shown in FIG. 6 can be produced.

Optionally, in some embodiments, the substrate 160 includes a first insulating layer 190 and a base 161, the first insulating layer 190 is located on the base 161, and the first insulating layer 190 isolates the base 161 from the multi-wing structure 110 and isolates the conductive structure 120 from the base 161. Therefore, based on the above steps 301 to 308, the capacitor as shown in FIG. 7 can be produced on the substrate 160.

Optionally, in some embodiments, the substrate 160 includes a first insulating layer 190, a first conductive layer 200 and a base 161, the first insulating layer is located on the base 161, and the first conductive layer 200 is located between the first insulating layer 190 and the base 161, where the N axis(axes) of the multi-wing structure 110 penetrates through the first insulating layer 190 along the first direction from an upper surface of the first insulating layer 200 and is electrically connected to the first conductive layer 200. Therefore, based on the above steps 301 to 308, the capacitor as shown in FIG. 8 can be produced on the substrate 160.

Optionally, in some embodiments, the substrate 160 is a low-resistivity substrate; and the producing the at least one first external electrode and the at least one second external electrode (step 308) includes:

producing the at least one first external electrode 140 under the substrate 160, and producing the at least one second external electrode 150 on the conductive structure 120.

Specifically, in the structure as shown in FIG. 16i, an electrode material is deposited on a lower surface of the substrate 160 to form the first external electrode 140, and an electrode material is deposited on an upper surface of the conductive structure 120 to form the second external electrode 150. Therefore, the capacitor as shown in FIG. 9 can be produced.

Figure 16L:
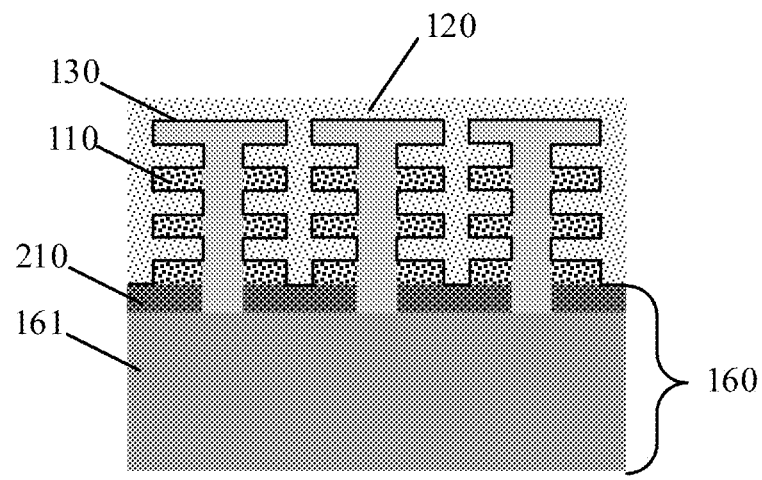
Figure 16M:
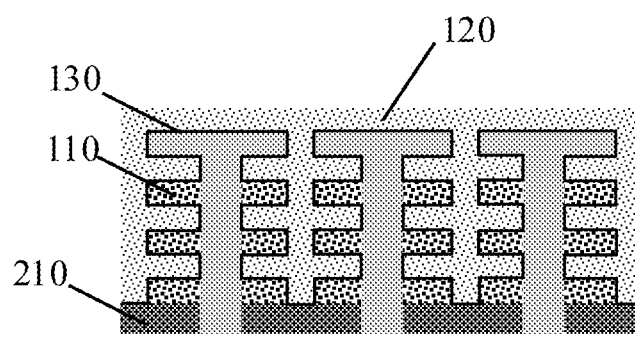

Optionally, in some embodiments, the substrate 160 includes a second insulating layer 210 and a base 161, the second insulating layer 210 is located on the base 161, and the second insulating layer 210 isolates the base 161 from the multi-wing structure 110 and isolates the conductive structure 120 from the base 161, and the N axis(axes) of the multi-wing structure penetrates through the second insulating layer along the first direction from an upper surface of the second insulating layer, as shown in FIG. 16l. Then, the base 161 is removed by a back surface thinning method to expose the N axis(axes), as shown in FIG. 16m. Finally, the at least one first external electrode 140 is produced under the second insulating layer 210, and the at least one second external electrode 150 is produced on the conductive structure 120. Therefore, the capacitor as shown in FIG. 10 can be produced.

Optionally, in some embodiments, the method 300 further includes:

producing an isolation ring 220, where the isolation ring 220 is located outside the at least one multi-wing structure 110, and the isolation ring 220 is disposed in the conductive structure 120 and extends into the conductive structure 120 along the first direction from an upper surface of the conductive structure 120 to isolate the conductive structure 120 into a first region and a second region, and the second external electrode is only electrically connected to the conductive structure in the first region.

Figure 16N:
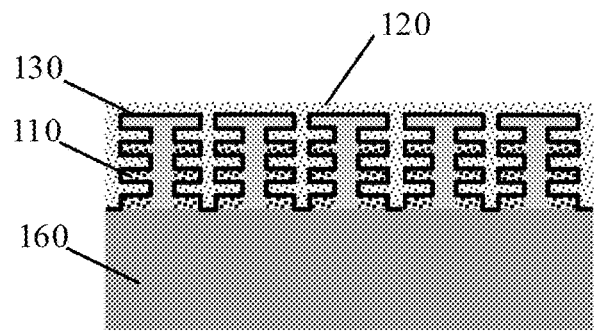
Figure 16O:
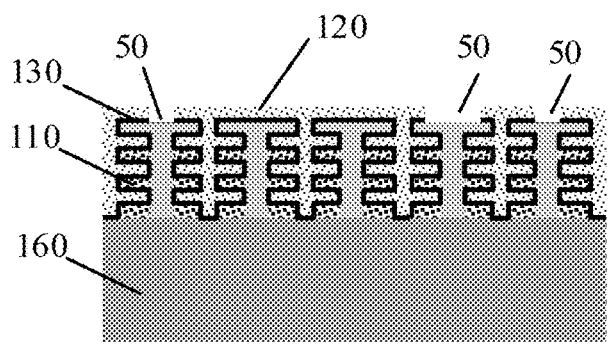
Figure 16P:
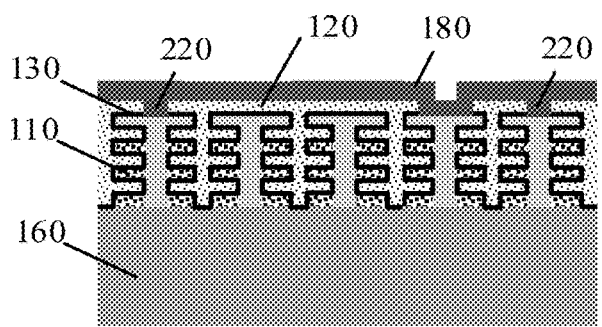
Figure 16Q:
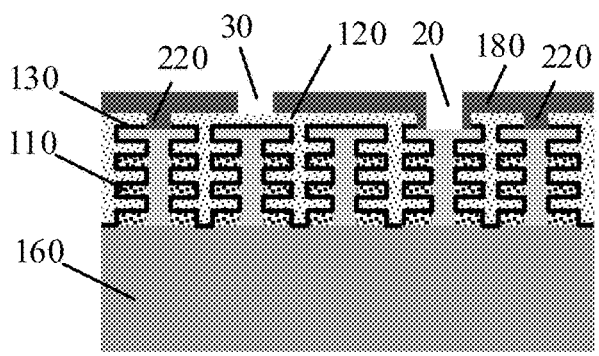

Specifically, in step 307, a structure as shown in FIG. 16n can be produced, and then photolithography processing is performed on the conductive structure 120 to form a window structure 50, expose the first conductive material in the multi-wing structure 110, and expose some of the first conductive material in the multi-wing structure that is located at an edge of a capacitor chip and does not constitute an electrode plate of the capacitor, as shown in FIG. 16o. Then, an insulating material is deposited on an upper surface of the conductive structure 120 and in the at least one window structure 50 to form an interlayer dielectric layer 180 and an isolation ring 220, as shown in FIG. 16p. Then, photolithography processing is performed on the interlayer dielectric layer 180 to form at least one first via structure 20 to expose the first conductive material in the multi-wing structure 110, and form at least one second via structure 30 to expose the conductive structure 120, as shown in FIG. 16q. Then, an electrode material is deposited on an upper surface of the interlayer dielectric layer 180 and in the first via structure 20 and the second via structure 30, and photolithography processing is performed to produce the capacitor as shown in FIG. 11.

It should be noted that the isolation ring 220 extends into some multi-wing structure(s) that is located at an edge of a capacitor chip and does not constitute an electrode plate of the capacitor along the first direction, thereby isolating the conductive structure 120 into a first region 121 and a second region 122, and the second external electrode 150 is only electrically connected to the conductive structure 120 in the first region 121.

Figure 16R:
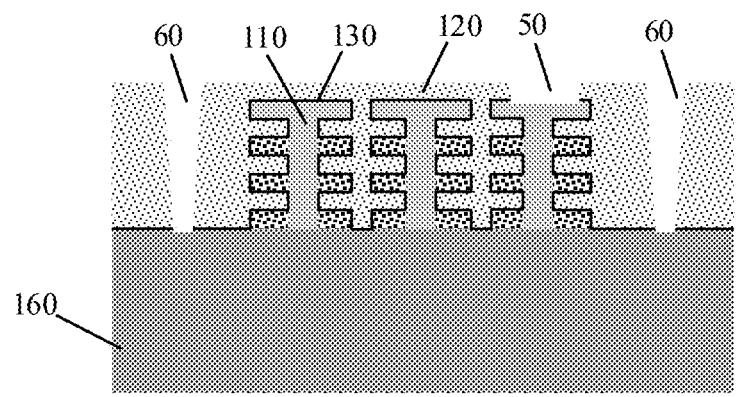
Figure 16S:
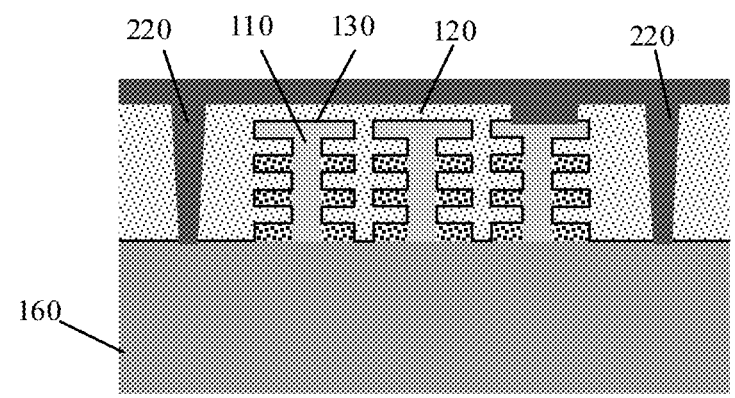
Figure 16T:
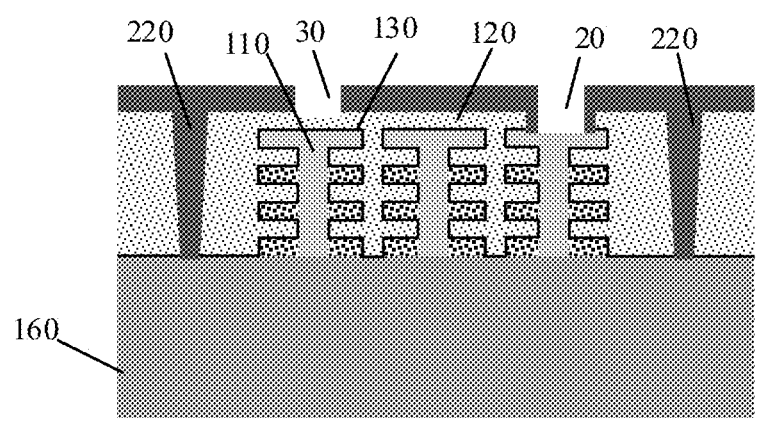

Specifically, in the structure as shown in FIG. 16i, photolithography processing is performed on the conductive structure 120 to form a window structure 50 in which the first conductive material in the multi-wing structure 110 is exposed and a ring-shaped trench 60 in which the substrate 160 is exposed, as shown in FIG. 16r. Then, an insulating material is deposited on an upper surface of the conductive structure 120, in the at least one window structure 50, and in the ring-shaped trench 60 to form the interlayer dielectric layer 180 and the isolation ring 220, as shown in FIG. 16s. Then, photolithography processing is performed on the interlayer dielectric layer 180 to form at least one first via structure 20 to expose the first conductive material in the multi-wing structure 110, and form at least one second via structure 30 to expose the conductive structure 120, as shown in FIG. 16t. Then, an electrode material is deposited on an upper surface of the interlayer dielectric layer 180 and in the first via structure 20 and the second via structure 30, and photolithography processing is performed to produce the capacitor as shown in FIG. 12.

Therefore, in the method for manufacturing the capacitor provided by the embodiment of the present disclosure, a capacitance value of the capacitor can be increased by producing the multi-wing structure.

A method for manufacturing a capacitor according to the present disclosure is further described below in conjunction with a specific embodiment. For ease of understanding, the capacitor as shown in FIG. 1 is manufactured in this embodiment. Of course, capacitors as shown in FIG. 5, FIG. 6, FIG. 7, FIG. 8, FIG. 9, FIG. 10, FIG. 11, and FIG. 12 may also be manufactured in the method for manufacturing the capacitor in the embodiment, except that settings of an electrode layer, a substrate, a multi-wing structure, a conductive structure, and an isolation ring as well as other parts are slightly different. For the sake of brevity, details are not described herein again.

Step 1: a silicon wafer is selected as a substrate. A laminated structure made of a second conductive material layer, a sacrificial material layer, a second conductive material layer, a sacrificial material layer, a second conductive material layer, and a sacrificial material layer (or may also be referred to as a film layer structure) is deposited on the substrate by a CVD process. The second conductive material is polysilicon heavily doped with boron, and the sacrificial material is BSG.

Step 2: a layer of photoresist is spin-coated on a surface of the laminated structure, and a number of photoresist notches are opened after exposure and development, and then the laminated structure that is not covered with the photoresist is removed by a dry etching process to form at least one first trench. Finally, the photoresist is removed.

Step 3: polysilicon heavily doped with boron is filled in the first trench as a first conductive material by a CVD process.

Step 4: a layer of photoresist is spin-coated on a surface of the first conductive material, and a number of photoresist notches are opened after exposure and development, and then the film layer structure that is not covered with the photoresist is removed by a dry etching process to form at least one second trench. Finally, the photoresist is removed.

Step 5: the first trench is used as a release hole, a hydrofluoric acid solution or gaseous hydrofluoric acid is used as a corrosion agent to remove BSG so as to obtain a multi-wing structure composed of polysilicon.

It should be noted that since projections of the first trench and the second trench on the substrate may take a variety of forms, there are also many possibilities for a three-dimensional shape of the multi-wing structure. FIGS. 2, 3, and 4 are possible topography of the multi-wing structure, respectively, but the shape is not limited thereto.

Figure 17:
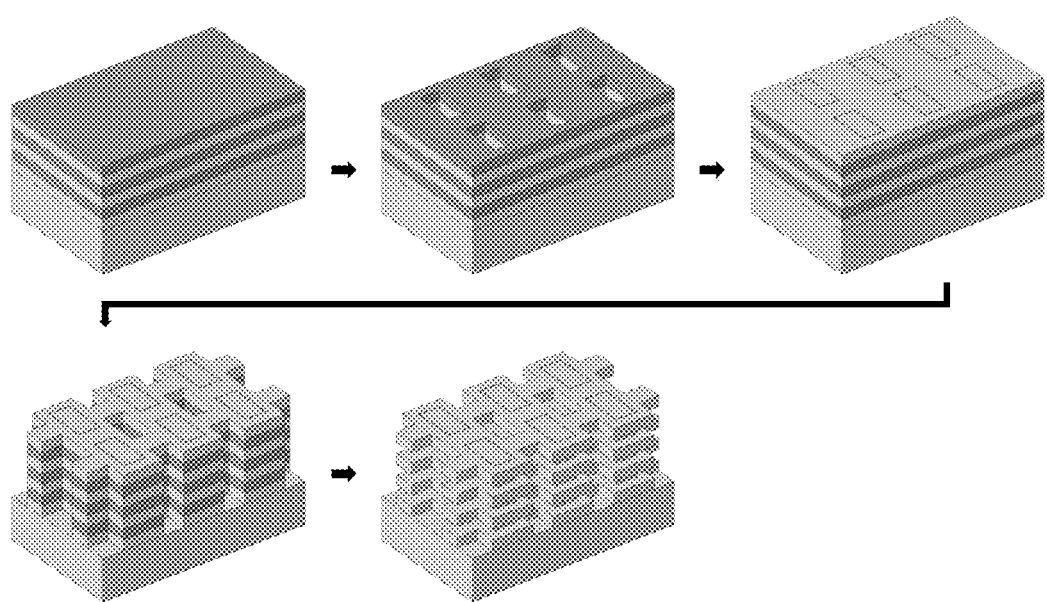
FIG. 17 is a schematic diagram of a 3D production process of a multi-wing structure according to an embodiment of the present disclosure.

Optionally, for a multi-wing structure as shown in FIG. 4, a production process may be as shown in FIG. 17.

Step 6, a layer of aluminum oxide is deposited on a surface of the multi-wing structure as a dielectric layer by an ALD process.

Step 7: polysilicon heavily doped with boron is deposited on a surface of the aluminum oxide as a conductive structure by an LPCVD process. The conductive structure fills and dads the entire multi-wing structure.

Step 8: a layer of photoresist is spin-coated on a surface of the conductive structure, a photoresist notch is opened after exposure and development, and then a conductive structure and a dielectric layer in the notch are removed by a dry etching process to expose the first conductive material in the multi-wing structure.

Step 9: a layer of USG is deposited as an insulating material by a PECVD process. A layer of photoresist is spin-coated on a surface of the USG, two photoresist notches are opened after exposure and development, and then a hydrofluoric acid solution is used to remove the USG in the notches. The two notches respectively expose the first conductive material and the conductive structure in the multi-wing structure.

Step 10: a layer of Al is deposited by a PVD process. Two pads (electrodes) made of Al are formed by photolithography. One of the pads is connected to the first conductive material in the multi-wing structure, and the other pad is connected to the conductive structure.

Step 11: the substrate is thinned from the back, and diced along a dicing path to obtain individual capacitor chips.

It should be noted that the dicing path may be flexibly set according to actual needs.

A person skilled in the art can understand that preferred embodiments of the present disclosure are described in detail above with reference to the accompanying drawings. However, the present disclosure is not limited to specific details in the foregoing embodiments. Within the technical concept of the present disclosure, the technical solution of the present disclosure may carry out a variety of simple variants, all of which are within the scope of protection of the present disclosure.

In addition, it should be noted that each of specific technical features described in the above specific embodiments may be combined in any suitable manner without contradiction. In order to avoid unnecessary repetition, various possible combination manners will not be described separately in the present disclosure.

In addition, any combination of various different embodiments of the present disclosure may also be made as long as it does not contradict the idea of the present disclosure, and should also be regarded as the content of the application.

What is claimed is:

1. A capacitor, wherein the capacitor comprises:
   at least one multi-wing structure, wherein each multi-wing structure comprises an axis and M wings, wherein the axis extends along a first direction, and the M wings are a convex structure formed by extending from side walls of the axis toward a direction perpendicular to the first direction, a first wing of the M wings and the axis are formed of a first conductive material, and wings other than the first wing is formed of a second conductive material, where M is an integer greater than or equal to 2;
   a conductive structure cladding the multi-wing structure and is complementary to the multi-wing structure in profile, and an edge of the capacitor is provided with the conductive structure;
   a dielectric layer disposed between the multi-wing structure and the conductive structure to isolate the multi-wing structure from the conductive structure;
   at least one first external electrode, wherein each first external electrode of the at least one first external electrode is electrically connected to some or all multi-wing structures of the at least one multi-wing structure;
   at least one second external electrode, wherein the second external electrode is electrically connected to the conductive structure;
   a substrate disposed under the multi-wing structure, and the dielectric layer is further disposed between the conductive structure and the substrate to isolate the conductive structure from the substrate; and
   an isolation ring located outside the at least one multi-wing structure, wherein the isolation ring is disposed in the conductive structure and extends into the conductive structure along the first direction from an upper surface of the conductive structure to isolate the conductive structure into a first region and a second region, and the second external electrode is only electrically connected to the conductive structure in the first region, and the isolation ring does not isolate the at least one multi-wing structure from the substrate.

2. The capacitor according to claim 1, wherein the dielectric layer is conformal to the multi-wing structure.

3. The capacitor according to claim 1, wherein the capacitor comprises N multi-wing structures comprising N axes totally, and the N axes extends into the substrate along the first direction from an upper surface of the substrate.

4. The capacitor according to claim 3, wherein the conductive structure extends into the substrate along the first direction from an upper surface of the substrate.

5. The capacitor according to claim 3, wherein the capacitor further comprises: a first insulating layer, wherein the first insulating layer is disposed between the substrate and the multi-wing structure to isolate the substrate from the multi-wing structure, and the first insulating layer is disposed between the conductive structure and the substrate to isolate the conductive structure from the substrate.

6. The capacitor according to claim 5, wherein the capacitor further comprises: a first conductive layer disposed between the first insulating layer and the substrate, wherein the N axes of the multi-wing structure penetrates through the first insulating layer along the first direction from an upper surface of the first insulating layer and is electrically connected to the first conductive layer.

7. The capacitor according to claim 1, wherein the capacitor further comprises: an electrode layer disposed on the conductive structure, wherein the electrode layer comprises at least one first conductive region and at least one second conductive region that are separated from each other, the first conductive region forms the first external electrode, and the second conductive region forms the second external electrode.

8. The capacitor according to claim 7, wherein the substrate is a low-resistivity substrate, the first external electrode is disposed under the substrate, and the second external electrode is disposed on the conductive structure.

9. The capacitor according to claim 1, wherein the capacitor further comprises: a second insulating layer disposed under the multi-wing structure, wherein the axis penetrates through the second insulating layer along the first direction from an upper surface of the second insulating layer, the first external electrode is disposed under the second insulating layer, and the second external electrode is disposed on the conductive structure.

10. The capacitor according to claim 1, wherein a sacrificial material is provided in a region between different wings of the M wings that is close to the axis, and the sacrificial material comprises at least one of:
    silicon, silicon oxide, silicon nitride, silicon-containing glass, carbon, and an organic polymer.

11. The capacitor according to claim 1, wherein the first wing is located above the remaining wings of the M wings.

12. The capacitor according to claim 1, wherein the first external electrode is electrically connected to some or all the multi-wing structures of the at least one multi-wing structure through at least one first via structure, the second external electrode is electrically connected to the conductive structure through at least one second via structure.

13. The capacitor according to claim 1, wherein the capacitor further comprises: an interconnection structure for electrically connecting the first external electrode to some or all the multi-wing structures of the at least one multi-wing structure.

14. The capacitor according to claim 1, wherein the first conductive material and/or the second conductive material comprises at least one of:
    heavily doped polysilicon, metal silicide, carbon, conductive polymer, aluminum, copper, nickel, tantalum nitride, titanium nitride, titanium aluminum nitride, tantalum silicon nitride, and tantalum carbon nitride.

15. The capacitor according to claim 1, wherein each wing of the multi-wing structure comprises at least one of:
    a heavily doped polysilicon layer, a metal silicide layer, a carbon layer, a conductive polymer layer, an aluminum layer, a copper layer, a nickel layer, a tantalum nitride layer, a titanium nitride layer, a titanium aluminum nitride layer, a tantalum silicon nitride layer, and a tantalum carbon nitride layer.

16. The capacitor according to claim 1, wherein a material of the conductive structure comprises at least one of:

heavily doped polysilicon, metal silicide, carbon, conductive polymer, aluminum, copper, nickel, tantalum nitride, titanium nitride, titanium aluminum nitride, tantalum silicon nitride, and tantalum carbon nitride; and the dielectric layer comprises at least one of:

a silicon oxide layer, a silicon nitride layer, a silicon oxynitride layer, a metal oxide layer, a metal nitride layer, and a metal oxynitride layer.

* * * * *